(12) United States Patent
Shiomi

(10) Patent No.: US 10,848,076 B2
(45) Date of Patent: Nov. 24, 2020

(54) RECTIFYING CIRCUIT AND POWER SUPPLY DEVICE

(71) Applicant: Sharp Kabushiki Kaisha, Sakai, Osaka (JP)

(72) Inventor: Takeshi Shiomi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/613,960

(22) PCT Filed: Apr. 23, 2018

(86) PCT No.: PCT/JP2018/016394
§ 371 (c)(1),
(2) Date: Nov. 15, 2019

(87) PCT Pub. No.: WO2018/235423
PCT Pub. Date: Dec. 27, 2018

(65) Prior Publication Data
US 2020/0153355 A1    May 14, 2020

(51) Int. Cl.
*H02M 7/217* (2006.01)
*H01L 27/06* (2006.01)
*H01L 29/778* (2006.01)

(52) U.S. Cl.
CPC ...... *H02M 7/2176* (2013.01); *H01L 27/0629* (2013.01); *H01L 29/7786* (2013.01)

(58) Field of Classification Search
CPC ............ H02M 7/2176; H01L 27/0629; H01L 29/7786
See application file for complete search history.

(56) References Cited

U.S. PATENT DOCUMENTS

2009/0206363 A1* 8/2009 Machida ............. H01L 27/0727
257/133
2009/0206812 A1 8/2009 Sasaya et al.
(Continued)

FOREIGN PATENT DOCUMENTS

JP        4557015 B2    10/2010

OTHER PUBLICATIONS

Polenov et al., "Influence of parasitic inductances on transient current sharing in parallel connected synchronous rectifiers and Schottky-barrier diodes", IET Circuits, Devices & Systems, vol. 1, Issue 5, Oct. 2017, pp. 387-394.

*Primary Examiner* — Kyle J Moody
*Assistant Examiner* — Lakaisha Jackson
(74) *Attorney, Agent, or Firm* — Keating & Bennett, LLP

(57) ABSTRACT

In a rectifying circuit including a HEMT and a diode connected antiparallel to the HEMT, a forward voltage drop when the diode starts to be conductive is made smaller than a voltage drop when the HEMT is reverse-conductive in an OFF state corresponding to an amount of rectified current when the HEMT is reverse-conductive in an ON state, inductance of a pathway extending through the diode is made larger than inductance of a pathway extending through the HEMT among the pathways connecting a source terminal and a drain terminal of the HEMT, and an amount of charge accumulated in a parasitic capacitance of the diode is made smaller than an amount of charge accumulated in an output capacitance of the HEMT. With this, there is provided a rectifying circuit in which switching loss due to the charge accumulated in the output capacitance of the HEMT is reduced.

20 Claims, 13 Drawing Sheets

(56) References Cited

U.S. PATENT DOCUMENTS

| | | | |
|---|---|---|---|
| 2013/0341641 A1* | 12/2013 | Nishiwaki | H01L 21/8258 257/77 |
| 2014/0054596 A1* | 2/2014 | Ritenour | H01L 27/0248 257/76 |
| 2016/0308523 A1* | 10/2016 | Otake | H01L 29/7805 |
| 2018/0295683 A1* | 10/2018 | Tung | H01L 29/861 |
| 2019/0068173 A1* | 2/2019 | Zojer | H03K 3/012 |
| 2019/0386652 A1* | 12/2019 | Korner | H03K 17/122 |

* cited by examiner

RECTIFYING CIRCUIT AND POWER SUPPLY DEVICE

TECHNICAL FIELD

The present disclosure relates to a switching power supply device, and more particularly relates to a rectifying circuit including a high electron mobility transistor (HEMT) as a switching element, and a power supply device using the same.

BACKGROUND ART

Switching power supply devices are widely used as power supply devices for electronic equipment. For example, a metal oxide semiconductor field effect transistor (MOSFET) is used for a switching element included in the switching power supply device. A diode having a PN junction parasitically exists between the drain and the source of the MOSFET. When a current flows through the parasitic diode, charge is accumulated in the PN junction and a reverse recovery current flows. Due to this, a switching power supply device using a MOSFET has a problem that switching loss is increased by the flow of the reverse recovery current.

PTL 1 describes a power switching circuit as a power supply circuit in which switching loss is reduced. In the stated power switching circuit, a second diode is disposed in parallel to a first diode that is connected in antiparallel to a semiconductor switching element so that a reverse recovery current is reduced by magnetic energy accumulated in a current pathway extending through the second diode. A similar circuit is described also in NPL 1.

A transistor using a compound semiconductor is known as a transistor without a parasitic diode. Hereinafter, attention is given to a HEMT, which is a type of transistor using a compound semiconductor. The HEMT is an N-channel transistor taking a two-dimensional electron gas as a channel, and does not contain a parasitic diode having a PN junction. Thus, in the HEMT, no charge is accumulated in the PN junction and no reverse recovery current flows. Accordingly, with a power supply device using a HEMT, switching loss can be significantly reduced.

CITATION LIST

Patent Literature

PTL 1: JP 4557015 B

Non Patent Literature

NPL 1: D. Polenov, et al., "Influence of parasitic inductances on transient current sharing in parallel connected synchronous rectifiers and Schottky-barrier diodes", IET Circuits, Devices & Systems, volume 1, issue 5, October 2007

SUMMARY

Technical Problem

In order to further reduce switching loss in a switching power supply device using a HEMT, switching loss due to charge accumulated in an output capacitance of the HEMT needs to be reduced.

Accordingly, it may be given as an issue to provide a rectifying circuit in which switching loss due to the charge accumulated in an output capacitance of a HEMT is reduced, and to provide a power supply circuit using the stated rectifying circuit.

Solution to Problem

The above issue can be solved by a rectifying circuit configured as described below. That is, the rectifying circuit includes, for example, a HEMT and a diode connected antiparallel to the HEMT. In the rectifying circuit, a forward voltage drop of the diode when the diode starts to be conductive is smaller than a voltage drop of the HEMT when the HEMT is reverse-conductive in an OFF state corresponding to an amount of rectified current when the HEMT is reverse-conductive in an ON state; inductance of a pathway extending through the diode is larger than inductance of a pathway extending through the HEMT among the pathways connecting a source terminal and a drain terminal of the HEMT; and an amount of charge accumulated in a parasitic capacitance of the diode is smaller than an amount of charge accumulated in an output capacitance of the HEMT. The above issue may also be solved by a power supply circuit equipped with such a rectifying circuit.

Advantage Effects of Disclosure

According to the rectifying circuit described above, when the HEMT is reverse-conductive in the ON state and the rectified current is flowing, in the case where the HEMT is turned off, part of the rectified current flows passing through the diode, and magnetic energy is accumulated in an inductor on the pathway extending through the diode (a difference in inductance between the two pathways). When the flow of the rectified current is stopped, a low voltage is generated by the accumulated magnetic energy and the output capacitance of the HEMT is charged by the low voltage. Thus, switching loss due to the charge accumulated in the HEMT output capacitance may be reduced. In addition, by making the amount of charge accumulated in the parasitic capacitance of the diode smaller than the amount of charge accumulated in the HEMT output capacitance, it is possible to reduce the switching loss due to the charge accumulated in the parasitic capacitance of the diode. Moreover, according to the power supply circuit provided with the rectifying circuit described above, it is possible to constitute a power supply circuit with reduced switching loss by using a rectifying circuit in which switching loss is reduced.

DESCRIPTION OF EMBODIMENTS

First Embodiment

Figure 1:
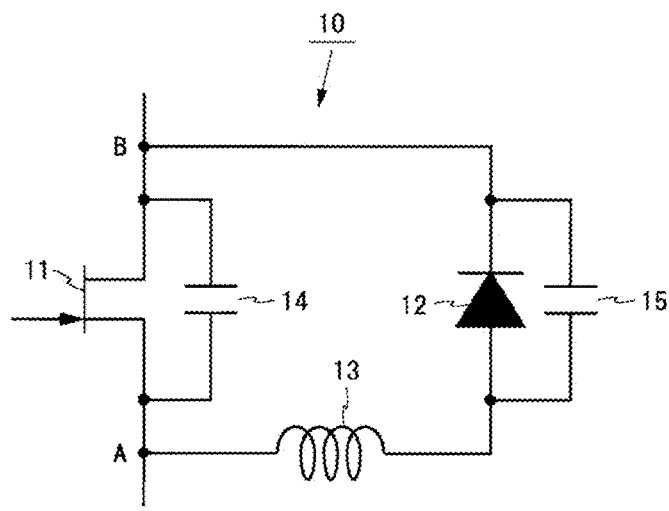
FIG. 1 is a circuit diagram of a rectifying circuit according to a first embodiment.

FIG. 1 is a circuit diagram of a rectifying circuit according to a first embodiment. A rectifying circuit 10 illustrated in FIG. 1 includes a HEMT 11 and a diode 12. An anode terminal of the diode 12 is connected to a source terminal of the HEMT 11, and a cathode terminal of the diode 12 is connected to a drain terminal of the HEMT 11. As described above, the diode 12 is connected antiparallel to the HEMT 11. An element that does not interrupt operation of the rectifying circuit 10 may be provided on a pathway connecting the diode 12 in antiparallel to the HEMT 11. Hereinafter, a situation in which the HEMT 11 allows a current to flow from the source terminal to the drain terminal is referred to as being reverse-conductive, and a current that flows at the time of being reverse-conductive is referred to as a reverse-direction current. As illustrated in FIG. 1, two points A and B are set.

In the following description, the HEMT 11 is a HEMT made of gallium nitride (hereinafter referred to as GaN-HEMT), and the diode 12 is a Schottky barrier diode made of silicon carbide (hereinafter referred to as SiC-SBD). More specifically, the HEMT 11 is considered to be a GaN-HEMT, where the rated voltage between the drain and the source is a class of 650 V with 60 A, on-resistance is 25 mΩ (junction temperature Tj=25° C.), and a threshold voltage is 2 V; the diode 12 is considered to be a SiC-SBD product, where the rated voltage is a class of 650 V with DC 6 A (case temperature Tc=25° C.).

The GaN-HEMT is suitable for the rectifying circuit 10 because it has a higher dielectric breakdown strength than the silicon transistor and has low resistance. The SiC-SBD is suitable for the rectifying circuit 10 because it does not generate a reverse recovery current and has a high withstand voltage. A gallium arsenide (GaAs)-based, indium phosphorus (InP)-based, or silicon-germanium (SiGe)-based HEMT may be used as the HEMT 11. A Fast Recovery Diode (FRD), a Schottky barrier diode made of silicon, or the like may be used as the diode 12. A GaN-HEMT has an advantage that an output capacitance thereof is smaller than that of a silicon transistor, a silicon carbide transistor, and the like. When a diode is connected in antiparallel to a GaN-HEMT with a small output capacitance, the capacitance is increased so that the advantage described above will be impaired.

The rectifying circuit 10 has the following features. First, a forward voltage drop of the diode 12 when the diode 12 starts to be conductive is smaller than a voltage drop of the HEMT 11 when the HEMT 11 is reverse-conductive in an OFF state corresponding to an amount of rectified current when the HEMT 11 is reverse-conductive in an ON state. Second, inductance of a pathway extending through the diode 12 is larger than inductance of a pathway extending through the HEMT 11 among the pathways connecting the source terminal and the drain terminal of the HEMT 11. Third, an amount of charge accumulated in a parasitic capacitance of the diode 12 is smaller than an amount of charge accumulated in an output capacitance of the HEMT 11.

The HEMT 11 is reverse-conductive, and a rectified current flows upward in the drawing, through the rectifying circuit 10. At this time, the point A functions as a branch point of the rectified current, and the point B functions as a meeting point of the rectified current. Between the source and drain terminals of the HEMT 11, there exist a pathway extending through the HEMT 11 and a pathway extending through the diode 12. In the rectifying circuit 10, the inductance of the pathway extending through the diode 12 is larger than the inductance of the pathway extending through the HEMT 11 (second feature). For example, when the inductance of the pathway extending through the HEMT 11 is 5 nH, the inductance of the pathway extending through the diode 12 is 50 nH. To represent this feature, an inductor 13 is described on the pathway extending through the diode 12 in the drawing. The inductor 13 is introduced for representing a magnitude relationship between the inductances of the two pathways, and is not absolutely necessary to be an inductor element.

The HEMT 11 has an output capacitance 14, and the diode 12 has a parasitic capacitance 15. The output capacitance 14 of the HEMT 11 includes capacitance between the drain and the source, and capacitance between the drain and the gate. Since the latter is smaller than the former, the latter is omitted in the drawing. The parasitic capacitance 15 of the diode 12 is capacitance between the anode and the cathode.

The rectified current flowing through the rectifying circuit 10 is, for example, a rectangular wave that is induced by using an inductor. When no rectified current flows, a high voltage is applied to the point B based on the point A. In the following description, it is considered that the rectified current is a rectangular wave that varies in a range from 0 A to 20 A, and that a voltage of 400 V is applied to the point B based on the point A when no rectified current flows.

The silicon transistor has a prescribed withstand voltage performance when a voltage in a prescribed direction is applied thereto, but easily becomes conductive when a voltage in the reverse direction is applied thereto. For example, the silicon transistor has a prescribed withstand voltage performance when a positive voltage is applied to the drain terminal based on the source terminal, but easily becomes conductive when a positive voltage is applied to the source terminal based on the drain terminal. This is because, when a voltage in the reverse direction is applied, a parasitic diode connected antiparallel to the silicon transistor becomes conductive. To achieve the above-mentioned performance of the GaN-HEMT (class of 650 V with 60 A, on-resistance of 25 mΩ) by using a silicon transistor, a low resistance silicon transistor called a super junction metal oxide semiconductor (SJMOS) needs to be used.

Figure 2:
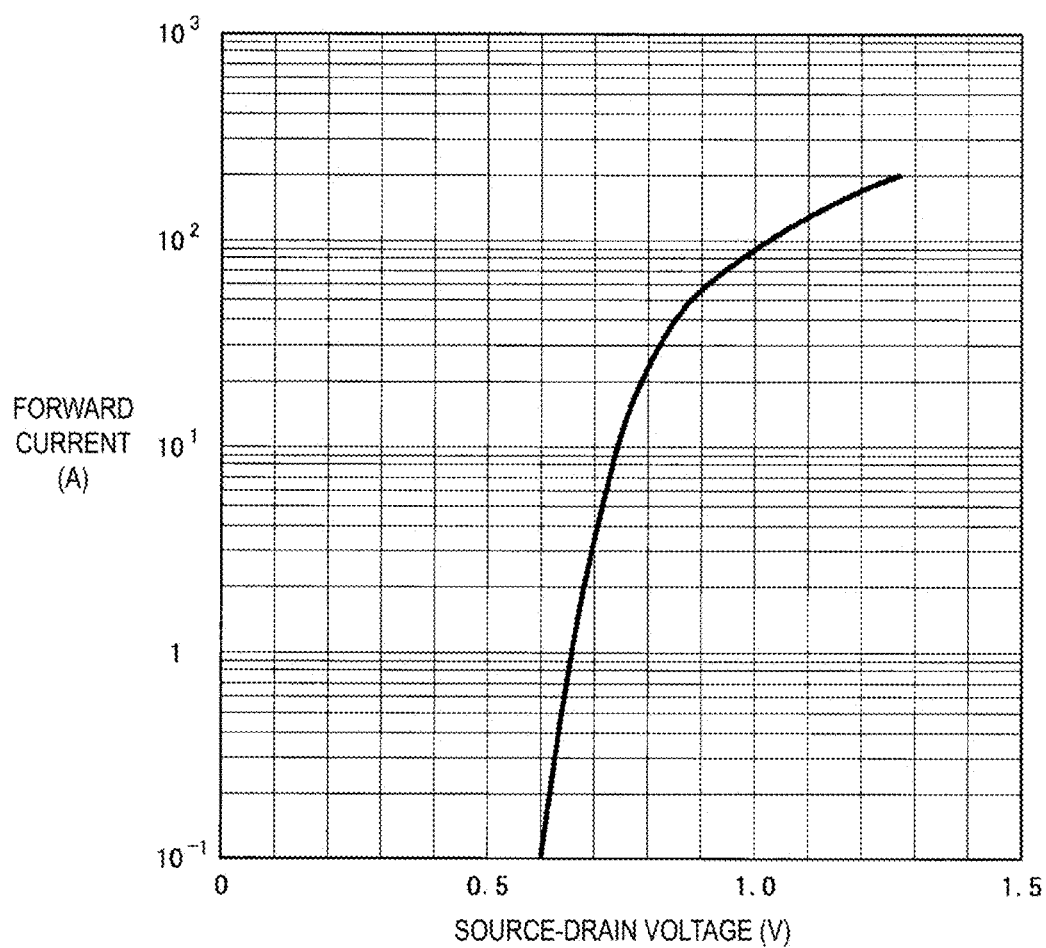
FIG. 2 is a characteristic diagram of a parasitic diode of an SJMOS.

FIG. 2 is a characteristic diagram of a parasitic diode of an SJMOS. In FIG. 2, the horizontal axis represents a voltage between the source and the drain (forward voltage drop), and the vertical axis represents a forward current. In an example illustrated in FIG. 2, the forward voltage drop is about 0.7 V when the current is 2 A, and the forward voltage drop is about 0.8 V when the current is 20 A. As discussed above, the forward voltage drop of the parasitic diode of the silicon transistor is too small to be used in the rectifying circuit 10. In a case where the silicon transistor having the characteristics illustrated in FIG. 2 is used in place of the HEMT 11 in the rectifying circuit 10, it is necessary for the forward voltage drop of the diode 12 to be smaller than 0.8 V in order to flow a current through the diode 12. However, diodes having such characteristics are not present in reality.

Since the HEMT 11 does not have a parasitic diode, a voltage drop due to a parasitic diode does not occur in the HEMT 11. On the other hand, since the HEMT 11 has a horizontal structure (a structure in which the source electrode, the gate electrode, and the drain electrode are formed on the same plane), a voltage drop occurs during the HEMT 11 being reverse-conductive. The voltage drop during the HEMT 11 being reverse-conductive can be made larger than the voltage drop due to the parasitic diode of the silicon transistor.

Figure 3:
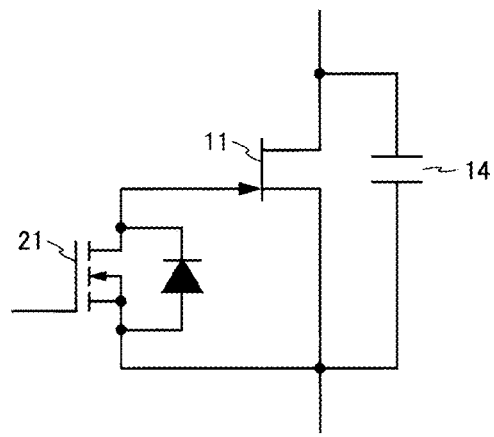
FIG. 3 is a diagram illustrating a method for controlling a gate voltage of a HEMT in the rectifying circuit illustrated in FIG. 1.

FIG. 3 is a diagram illustrating a method for controlling the gate voltage of the HEMT 11. As illustrated in FIG. 3, a transistor 21 is provided between the gate and source terminals of the HEMT 11. A drain terminal of the transistor 21 is connected to the gate terminal of the HEMT 11, and a source terminal of the transistor 21 is connected to the source terminal of the HEMT 11. A resistor, a diode, or the like may be provided on a pathway connecting the HEMT 11 and the transistor 21.

When the transistor 21 is turned on, the HEMT 11 gate voltage is controlled to be at the same level as the source voltage. In this state, when a positive voltage (reverse-direction voltage) is applied to the source terminal of the HEMT 11 based on the drain terminal thereof, the gate voltage rises along with the source voltage and becomes higher than the drain voltage. When the voltage between the gate and the drain rises up to the vicinity of the threshold voltage of the HEMT 11, the HEMT 11 becomes reverse-conductive. In the case where the HEMT 11 has a positive threshold voltage, by short-circuiting the gate and source terminals of the HEMT 11 and causing the HEMT 11 to be reverse-conductive, the voltage drop of the HEMT 11 during its reverse-conduction is increased to make it easy for a current to flow through the diode 12.

Figure 4:
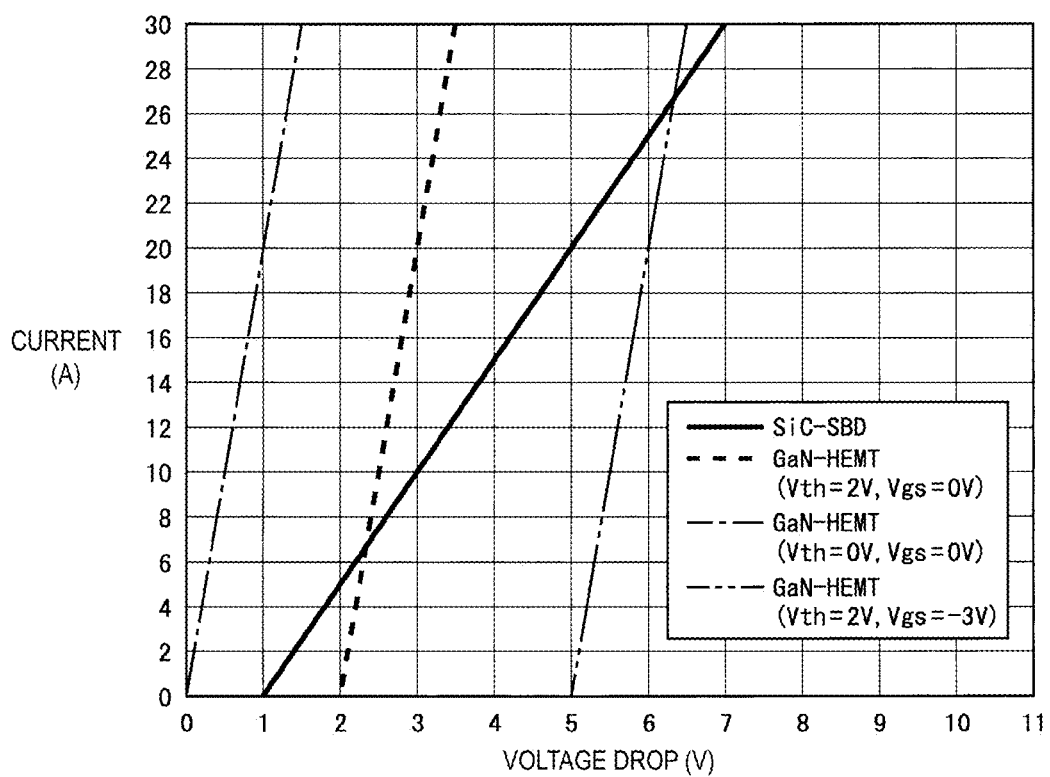
FIG. 4 is a characteristic diagram of a GaN-HEMT and a SiC-SBD.

FIG. 4 is a characteristic diagram of a GaN-HEMT and a SiC-SBD. In FIG. 4, the vertical axis represents a current flowing through the GaN-HEMT or SiC-SBD, and the horizontal axis represents a voltage drop of the GaN-HEMT during the reverse-conduction thereof or a forward voltage drop of the SiC-SBD. A graph of a solid line shows characteristics of the SiC-SBD according to the present embodiment. A graph of a broken line shows characteristics of the GaN-HEMT having a threshold voltage of 2 V according to the present embodiment. A graph of a dot-dash line shows characteristics of the GaN-HEMT having a threshold voltage of 0 V. The characteristics shown by the graphs of the broken and dot-dash lines are characteristics when the voltage between the gate and the source is 0 V (characteristics when the GaN-HEMT is in the OFF state). A graph of a double-dot dash line will be described in a third embodiment. The slope of each graph indicates a resistive component of the element. The four graphs illustrated in FIG. 4 linearly approximate actual measurement data.

The HEMT having a threshold voltage of 0 V becomes reverse-conductive at a lower voltage than the HEMT having a threshold voltage of 2 V. A normally-on type HEMT (not illustrated) becomes reverse-conductive at a lower voltage than the HEMT having a threshold voltage of 0 V. As a voltage at which the HEMT starts to be reverse-conductive is lower, a voltage drop of the HEMT is smaller during the reverse conduction thereof.

In this embodiment, in order to increase the voltage drop during the reverse-conduction, a HEMT having a positive threshold voltage is used as the HEMT 11. However, when the threshold voltage of the HEMT 11 is too high, the loss due to the voltage drop increases. Therefore, it is preferable for the threshold voltage of the HEMT 11 to be equal to or higher than 0.5 V and equal to or lower than 5 V, and more preferable to be equal to or higher than 1 V and equal to or lower than 3 V.

As indicated by the broken line in FIG. 4, the voltage drop during the reverse-conduction of the GaN-HEMT having a threshold voltage of 2 V is about 2.1 V when the current is 2 A and is about 3.0 V when the current is 20 A. Since the voltage drop during the reverse-conduction of the HEMT 11 is larger than a voltage drop due to the parasitic diode of the silicon transistor, a current is likely to flow through the diode 12 during the reverse-conduction of the HEMT 11. By controlling the HEMT 11 gate voltage to make it at the same level as the source voltage by using the transistor 21 as described above, the voltage drop of the HEMT 11 during the reverse-conduction may be increased.

As indicated by the solid line in FIG. 4, the forward voltage drop is 1 V when the SiC-SBD starts to be conductive. The forward voltage drop of the SiC-SBD is about 1.4 V when the current is 2 A, and is about 5.0 V when the current is 20 A. The forward voltage drop of the SiC-SBD is small when the current is small, but is larger than the voltage drop of the GaN-HEMT during its reverse-conduction when the current is equal to or larger than a prescribed one. The SiC-SBD becomes conductive at a low voltage, but as a current increases, the forward voltage drop of the SiC-SBD is significantly increased due to the influence of the resistive component.

In the rectifying circuit 10, it is most preferable that, within a range of the current used, the forward voltage drop of the diode 12 be smaller than the voltage drop of the HEMT 11 during the reverse-conduction. In the example illustrated in FIG. 4, it is most preferable that the above condition be satisfied in a range from 0 A to 20 A. Simply considering, it seems to be sufficient that the resistance of the diode 12 is reduced. However, reducing the resistance of the diode 12 increases the parasitic capacitance 15 of the diode 12 so that the charge accumulated in the parasitic capacitance 15 is increased. Thus, in the rectifying circuit 10, it is required that the amount of charge accumulated in the parasitic capacitance 15 of the diode 12 is smaller than the amount of charge accumulated in the output capacitance 14 of the HEMT 11 (third feature). Accordingly, the parasitic capacitance 15 having influence on the above condition (forward voltage drop) may not be unconditionally reduced. In other words, the resistive component having influence on the parasitic capacitance 15 may not be unconditionally reduced. The graph of the solid line illustrated in FIG. 4 is set in such a manner that the resistance of the diode 12 does not become too high while causing the amount of charge accumulated in the parasitic capacitance 15 of the diode 12 to be small as much as possible.

In order to reduce the switching loss in the rectifying circuit 10, it is required that the forward voltage drop of the diode 12 when the diode 12 starts to be conductive is smaller than the voltage drop of the HEMT 11 when the HEMT 11 is reverse-conductive in the OFF state corresponding to the amount of rectified current when the HEMT 11 is reverse-conductive in the ON state (first feature). In the example described above, the forward voltage drop when the diode 12 starts to be conductive is 1.0 V, the amount of rectified current when the HEMT 11 is reverse-conductive in the ON state is 20 A, and the voltage drop when the HEMT 11 is reverse-conductive in the OFF state corresponding to the above 20 A is approximately 3.0 V. Accordingly, the rectifying circuit 10 has the first feature.

It is preferable that the rectifying circuit 10 have, in addition to the first to third features, a feature (fourth feature) in which the forward voltage drop of the diode 12 corresponding to 10% of the amount of rectified current when the HEMT 11 is reverse-conductive in the ON state is smaller, by equal to or larger than 0.2 V, than the voltage drop of the HEMT 11 when the HEMT 11 is reverse-conductive in the OFF state corresponding to the amount of rectified current when the HEMT 11 is reverse-conductive in the ON state.

When a difference in voltage drop is equal to or greater than 0.5 V, the switching loss may be more effectively reduced. On the other hand, when the difference in voltage drop is equal to or greater than 10 V, since the voltage drop of the former is equal to or greater than 10 V, the loss due to the current flowing through the HEMT 11 is increased. Therefore, it is preferable for the difference in voltage drop to be equal to or greater than 0.2 V and equal to or smaller than 10 V, and more preferable to be equal to or greater than 0.5 V and equal to or smaller than 10 V. In the above example, the forward voltage drop of the SiC-SBD corresponding to 2 A is about 1.4 V, while the voltage drop of the GaN-HEMT corresponding to 20 A is about 3.0 V. Accordingly, the rectifying circuit 10 has the fourth feature. In this case, it is sufficient that the forward voltage drop of the SiC-SBD corresponding to 2 A is equal to or smaller than 2.8 V.

The inductor 13 will be described below. In the rectifying circuit 10, the inductor 13 is provided on the pathway extending through the diode 12. Since the rectifying circuit 10 has the first feature, part of the current that flows passing through the HEMT 11 when the HEMT 11 is reverse-conductive in the ON state, flows passing through the diode 12 after the HEMT 11 is turned off. When this current flows through the inductor 13, magnetic energy is accumulated in the inductor 13. When the inductor 13 is used to charge the output capacitance 14 of the HEMT 11, inductance of the pathway extending through the HEMT 11 interrupts the charging. Therefore, the inductance of the pathway extending through the HEMT 11 is preferably as small as possible.

In order to reduce the switching loss, it is preferable for inductance of the pathway extending through the diode 12 to be twice or more the inductance of the pathway extending through the HEMT 11, and more preferably to be 10 times or more. It is preferable that the difference in inductance be larger, but in the case where the difference is too large, it takes time when the current is increased. Therefore, the inductance of the pathway extending through the diode 12 is preferably equal to or less than 100 thousand times the inductance of the pathway extending through the HEMT 11. Here, the inductance refers to inductance in the vicinity of a current being 0 A.

The inductor 13 is provided between the point A and the anode terminal of the diode 12 in FIG. 1. However, an inductor may be provided between the point B and the cathode terminal of the diode 12, or inductors may be provided both between the point A and the anode terminal of the diode 12 and between the point B and the cathode terminal of the diode 12. Whichever position is selected for providing the inductor, the same effect can be obtained as long as the inductance is the same.

Hereinafter, the relationship between the amount of charge accumulated in the output capacitance 14 of the HEMT 11 and the amount of charge accumulated in the parasitic capacitance 15 of the diode 12 will be described. The former is the amount of charge that flows when charging the output capacitance 14 to a prescribed voltage, while the latter is the amount of charge that flows when charging the parasitic capacitance 15 to a prescribed voltage. In order to suppress the loss due to the charge accumulated in the parasitic capacitance 15, it is preferable for the amount of charge accumulated in the parasitic capacitance 15 to be as small as possible.

When the amount of charge accumulated in the parasitic capacitance 15 is 70% or more of the amount of charge accumulated in the output capacitance 14, there arises a problem that the loss due to the charge accumulated in the parasitic capacitance 15 is large. When the amount of charge accumulated in the parasitic capacitance 15 is 0.5% or less of the amount of charge accumulated in the output capacitance 14, there arises a problem that the resistance of the diode 12 is large. Accordingly, it is preferable for the amount of charge accumulated in the parasitic capacitance 15 to be equal to or more than 0.5% and equal to or less than 70% of the amount of charge accumulated in the output capacitance 14, and more preferable to be equal to or more than 5% and equal to or less than 30% thereof. In the above example, when the voltage is 400 V, the amount of charge accumulated in the GaN-HEMT output capacitance is 110 nC, and the amount of charge accumulated in the SiC-SBD parasitic capacitance is 8 nC. In this case, the amount of charge accumulated in the parasitic capacitance 15 is within a preferred range, that is, is approximately 7% of the amount of charge accumulated in the output capacitance 14.

Figure 5:
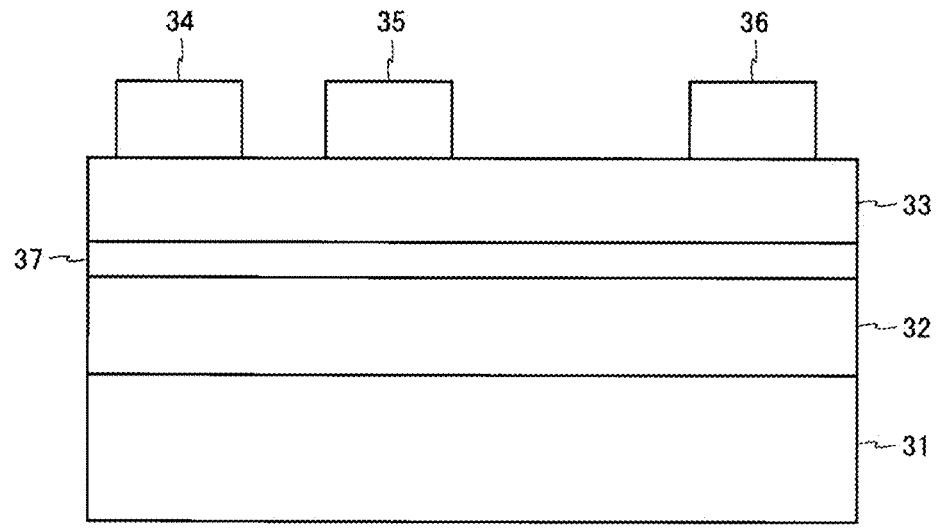
FIG. 5 is a cross-sectional view of a GaN-HEMT.

FIG. 5 is a cross-sectional view of a GaN-HEMT. As illustrated in FIG. 5, the GaN-HEMT has a structure in which a GaN layer 32 and an AlGaN layer 33 are formed on a silicon substrate 31, and a source electrode 34, a gate electrode 35, and a drain electrode 36 are disposed side by side. A two-dimensional electron gas layer 37 is formed between the GaN layer 32 and the AlGaN layer 33. The silicon substrate 31 is doped to be an N-type and functions as a conductive layer. The two-dimensional electron gas layer 37 under the gate electrode 35 is depleted when a voltage between the gate and the source is 0 V. The silicon substrate 31 and the source electrode 34 are electrically connected to each other by a connection method (not illustrated). A buffer layer may be provided between the silicon substrate 31 and the GaN layer 32.

In the GaN-HEMT, a conductive layer (the silicon substrate 31) is present in a lower layer relative to the two-dimensional electron gas layer 37, and the conductive layer and the source electrode 34 are electrically connected. Therefore, electrostatic capacitance is formed between the drain electrode 36 and the conductive layer having the same voltage as the source electrode 34. Electrostatic capacitance is also formed between the conductive layer and the two-dimensional electron gas layer 37 connected to the drain electrode 36. Since these two electrostatic capacitances are newly formed in this manner, the output capacitance of the GaN-HEMT is increased.

Even when the conductive layer and the source electrode 34 are not electrically connected, electrostatic capacitance is formed between the conductive layer and the source electrode 34, and between the conductive layer and the drain electrode 36. Therefore, it is difficult to completely eliminate the effect of providing the conductive layer. This point is less problematic when a distance between the conductive layer and the two-dimensional electron gas layer 37 is equal to or longer than 200 μm, but is problematic when the distance is equal to or shorter than 50 μm, and there arises a big problem when the distance is equal to or shorter than 10 μm.

Figure 6:
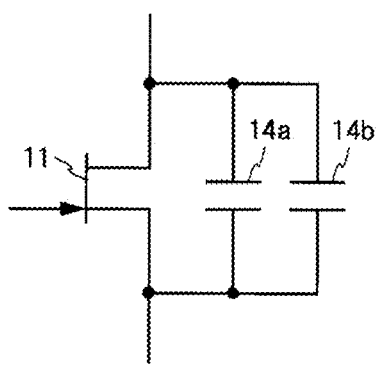
FIG. 6 is a diagram illustrating details of an output capacitance of the HEMT illustrated in FIG. 1.

FIG. 6 is a diagram illustrating details of the output capacitance 14 of the HEMT 11. As illustrated in FIG. 6, the output capacitance 14 includes an output capacitance 14a as a general capacitance, and an output capacitance 14b produced due to the conductive layer. In the drawings other than the drawing in FIG. 6, the two output capacitances 14a and 14b are collectively described as a single output capacitance 14. The conductive layer of the HEMT is not limited to an N-type doped silicon substrate; that is, the same result is also achieved by using a P-type doped silicon substrate or by using another member having conductivity.

Figure 7:
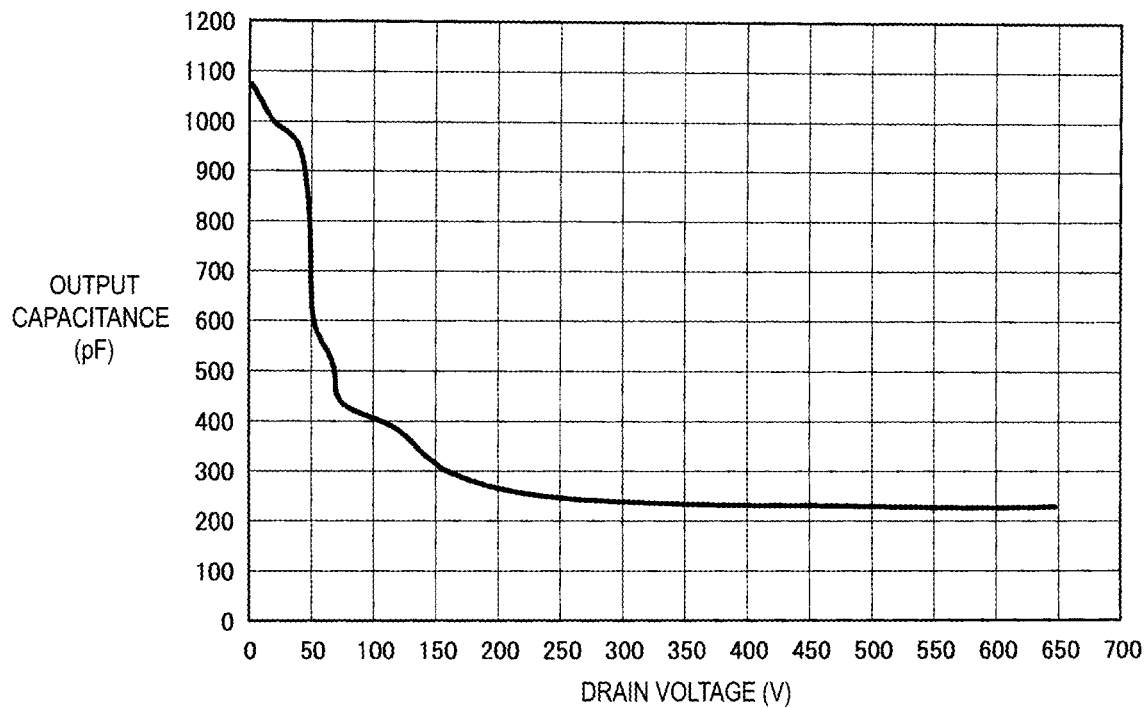
FIG. 7 is a characteristic diagram of a GaN-HEMT.

FIG. 7 is a characteristic diagram of a GaN-HEMT. In FIG. 7, the horizontal axis represents the drain voltage, and the vertical axis represents the output capacitance. In this example, the rated voltage of the GaN-HEMT is 650 V. As illustrated in FIG. 7, the output capacitance of the GaN-HEMT varies in accordance with the drain voltage. The output capacitance becomes larger as the drain voltage is lower, and becomes particularly large when the drain voltage is equal to or lower than a prescribed value (in this case, 50 V).

Figure 8:
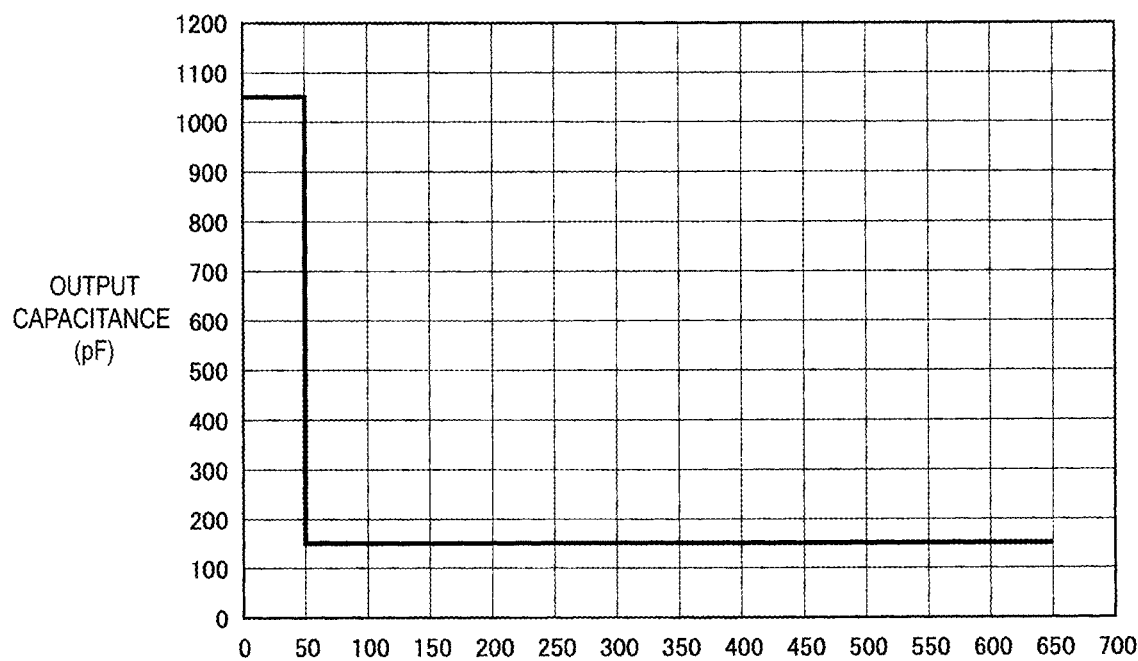
FIG. 8 is a diagram illustrating modeling characteristics of a GaN-HEMT.

FIG. 8 is a diagram illustrating modeling characteristics of the GaN-HEMT. The characteristics illustrated in FIG. 8 are obtained by linearly approximating the characteristics illustrated in FIG. 7. Hereinafter, for facilitation of explanation, the GaN-HEMT is considered to have the characteristics illustrated in FIG. 8. A rectifying circuit including the HEMT 11 and including none of the diode 12 and the inductor 13 is referred to as a rectifying circuit according to a comparative example.

In the rectifying circuit according to the comparative example, loss is generated when the output capacitance 14 of the HEMT 11 is charged. In particular, loss is likely to be generated when the output capacitance 14 is charged at a high voltage (a voltage of 400 V applied to the drain terminal of the HEMT 11). Most of the loss is generated when the voltage of the output capacitance 14 is low in the initial stage of charging. Since the output capacitance 14 of the HEMT 11 is large when the voltage is low (see FIG. 8), a rise in voltage of the output capacitance 14 is slow in the initial stage of charging and the period in which the voltage is low continues for a long time, so that the loss becomes larger. The charge that flows when the voltage of the output capacitance 14 is low generates a larger loss than the charge that flows when the voltage of the output capacitance 14 is high.

In the rectifying circuit 10 according to the present embodiment, the diode 12 and the inductor 13 charge the output capacitance 14 of the HEMT 11 when the voltage of the output capacitance 14 is low. The inductor 13 generates a low voltage when the voltage of the output capacitance 14 is low, and uses this voltage to charge the output capacitance 14 of the HEMT 11. Thus, the loss may be effectively reduced for the GaN-HEMT, which exhibits such characteristics that the output capacitance is larger as the voltage is lower.

In order to obtain the effect described above, it is preferable for the average of the output capacitance 14 of the HEMT 11, when the drain voltage of the HEMT 11 falls within a range from 0% to 10% of the rated voltage, to be twice or more the output capacitance 14 of the HEMT 11 when the drain voltage of the HEMT 11 takes the rated voltage, and more preferable to be four times or more.

In the example illustrated in FIG. 8, the output capacitance is 1050 pF when the drain voltage is in a range from 0 V to 50 V, and the output capacitance is 150 pF when the drain voltage is in a range from 50 V to 650 V. The average of the output capacitance is 840 pF when the drain voltage falls within a range from 0% to 10% of the rated voltage (a range from 0 V to 65 V). The average of the output capacitance may be said to be a more preferable value because it is 5.6 times the output capacitance when the drain voltage takes the rated voltage.

Operations of the rectifying circuit 10 will be described below. First, a positive voltage is applied to the point A based on the point B. At this time, the rectifying circuit 10 becomes reverse-conductive to flow a prescribed amount of rectified current. The HEMT 11 is turned on after the rectified current starts to flow. The rectified current flows through the HEMT 11 while the HEMT 11 is in the ON state. The HEMT 11 is turned off before the flow of the rectified current is stopped. Since the rectifying circuit 10 has the first feature, after the HEMT 11 is turned off, part of the rectified current flows passing through the diode 12. The rectified current eventually branches and flows on two pathways in accordance with resistance and rising voltage characteristics of the elements. For example, a rectified current of 20 A branches into a current of 12 A flowing through the HEMT 11, and a current of 8 A flowing through the diode 12 and the inductor 13. The latter current causes magnetic energy to be accumulated in the inductor 13. When the current of 20 A flows, the voltage at the point A comes to be approximately 2.6 V based on the point B.

Next, in order to stop the flow of the rectified current, a positive voltage of 400 V is applied to the point B based on the point A. This decreases the rectified current. With the decrease of the rectified current, a voltage is generated in the inductor 13, and a current flows due to the magnetic energy accumulated in the inductor 13, whereby the output capacitance 14 of the HEMT 11 is charged.

In the rectifying circuit according to the comparative example, the output capacitance 14 of the HEMT 11 is charged by a voltage of 400 V applied between the two points A and B. This makes the charge rapidly flow so that the loss due to charging increases. In the case where the output capacitance 14 is charged to 400 V, the charge rapidly flows in the initial stage of charging (when the voltage of the output capacitance 14 is low).

In contrast, in the rectifying circuit 10, the output capacitance 14 of the HEMT 11 is charged by the low voltage generated in the inductor 13. Unlike the rectifying circuit according to the comparative example, the charge does not rapidly flow so that the loss due to charging can be reduced. Since the voltage generated in the inductor 13 automatically matches the voltage of the output capacitance 14, the inductor 13 does not generate a higher voltage than necessary.

Thus, according to the rectifying circuit 10, loss in the output capacitance 14 of the HEMT 11 at the start of charging can be reduced.

In the rectifying circuit 10, the output capacitance 14 of the HEMT 11 is charged by the voltage generated in the inductor 13 and the voltage applied between the two points A and B. In the rectifying circuit according to the comparative example, most of the loss due to the charging is generated when the voltage of the output capacitance 14 is low. On the other hand, in the rectifying circuit 10, it is possible to reduce the loss when the voltage of the output capacitance 14 is low. Thus, according to the rectifying circuit 10, even in a case where the output capacitance 14 is charged by using the voltage applied between the two points A and B after the voltage of the output capacitance 14 slightly rises, loss can be reduced in comparison with the rectifying circuit according to the comparative example.

For example, in the case where a voltage of 400 V is applied between the two points A and B, the loss due to charging can be reduced when the output capacitance 14 is charged to 20 V (5% of 400 V) by using the voltage generated in the inductor 13. To achieve the effect of loss reduction, it is only necessary to be able to charge the output capacitance 14 to at least 4 V (1% of 400 V) by using the voltage generated in the inductor 13. Preferably, in the case where the output capacitance 14 is charged to 200 V (50% of 400 V) or more, the effect of loss reduction is large. The limit to which the output capacitance 14 can be charged is 400 V (100% of 400 V) defined in the circuit specifications.

A case in which the voltage of 400 V is applied between the two points A and B has been described thus far, and the higher the applied voltage is, the larger the effect of loss reduction is. In order to achieve the effect of loss reduction, it is sufficient that the applied voltage is equal to or higher than 100 V. In order to sufficiently achieve the effect of loss reduction, it is preferable for the applied voltage to be equal to or higher than 100 V, and more preferable to be equal to or higher than 350 V. In consideration of the structure of the HEMT 11, the limit of the applied voltage is 1200 V.

As described above, with the rectifying circuit 10 according to the present embodiment, by charging the output capacitance 14 of the HEMT 11 by using the inductor 13, it is possible to prevent the charge from rapidly flowing and to reduce the loss due to the charging of the output capacitance 14 of the HEMT 11.

Figure 9:
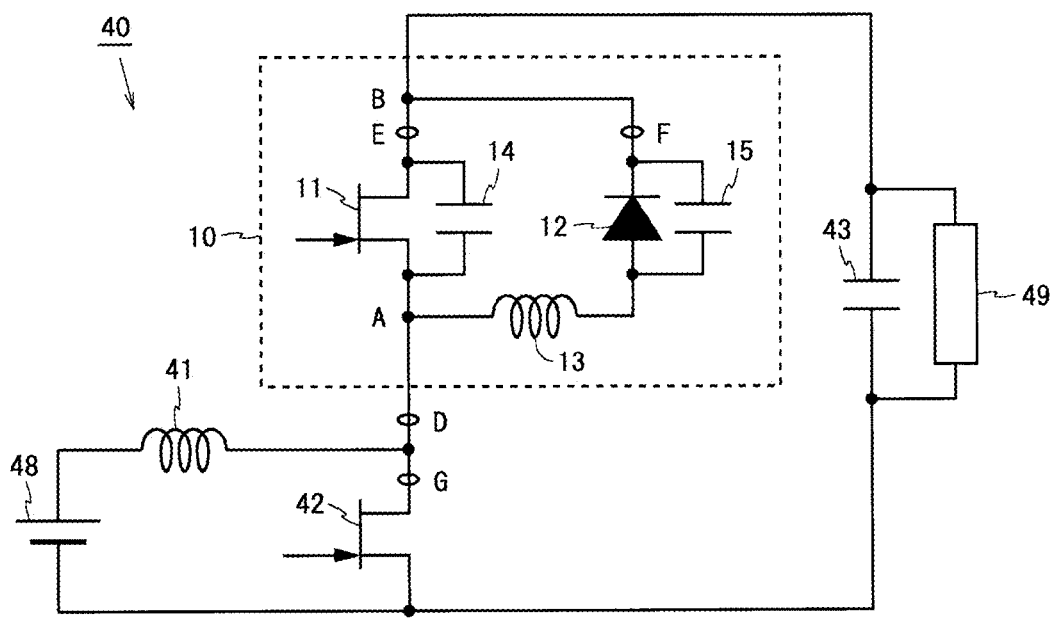
FIG. 9 is a circuit diagram of a power supply circuit (step-up chopper circuit) according to the first embodiment.

A power supply circuit including the rectifying circuit 10 will be described below. FIG. 9 is a circuit diagram of a power supply circuit (step-up chopper circuit) according to the present embodiment. A step-up chopper circuit 40 illustrated in FIG. 9 includes the rectifying circuit 10, a coil 41, a HEMT 42 and a smoothing capacitor 43, and is connected to a DC power supply 48 and a DC load 49. One end (the left end in FIG. 9) of the coil 41 is connected to a positive electrode of the DC power supply 48. The other end of the coil is connected to a second terminal (a terminal on the lower side in FIG. 9) of the rectifying circuit 10 and to a drain terminal of the HEMT 42. A first terminal of the rectifying circuit 10 is connected to one end (the upper end in FIG. 9) of the DC load 49. A source terminal of the HEMT 42 is connected to a negative electrode of the DC power supply 48 and to the other end of the DC load 49. The smoothing capacitor 43 is disposed between both ends of the DC load 49.

Hereinafter, an output voltage of the DC power supply 48 is 200 V, inductance of the coil 41 is 10 mH, the average of a current flowing through the coil 41 is 20 A, a resistance value of the DC load 49 is 40Ω, electrostatic capacitance of the smoothing capacitor 43 is 10 mF, a voltage across both the ends of the DC load 49 is 400 V, and the HEMT 42 is a GaN-HEMT having the same characteristics as the HEMT 11. The HEMT 42 functions as a switching element.

As illustrated in FIG. 9, a point D, a point E, a point F, and a point G are set. A current flowing through the point D is a current flowing through the rectifying circuit 10. A current flowing through the point E is a current flowing through the HEMT 11. A current flowing through the point F is a current flowing through the diode 12. A current flowing through the point G is a current flowing through the HEMT 42. The current flowing through the point D is the sum of the current flowing through the point E and the current flowing through the point F. The sign of each of the currents flowing through the points D, E, and F is considered to be positive when the current flows upward in the drawing. The sign of the current flowing through the point G is considered to be positive when the current flows downward in the drawing.

Figure 10:
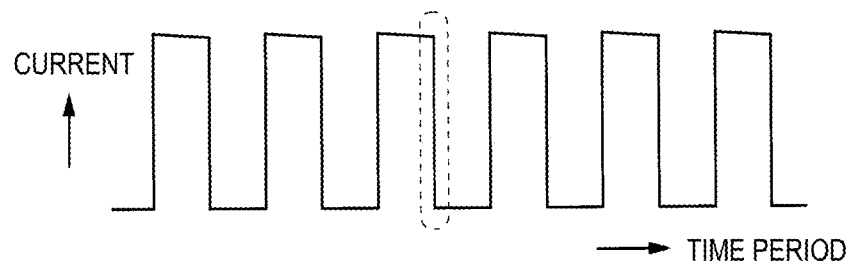
FIG. 10 is a waveform diagram of a current flowing through a point D illustrated in FIG. 9.
Figure 11:
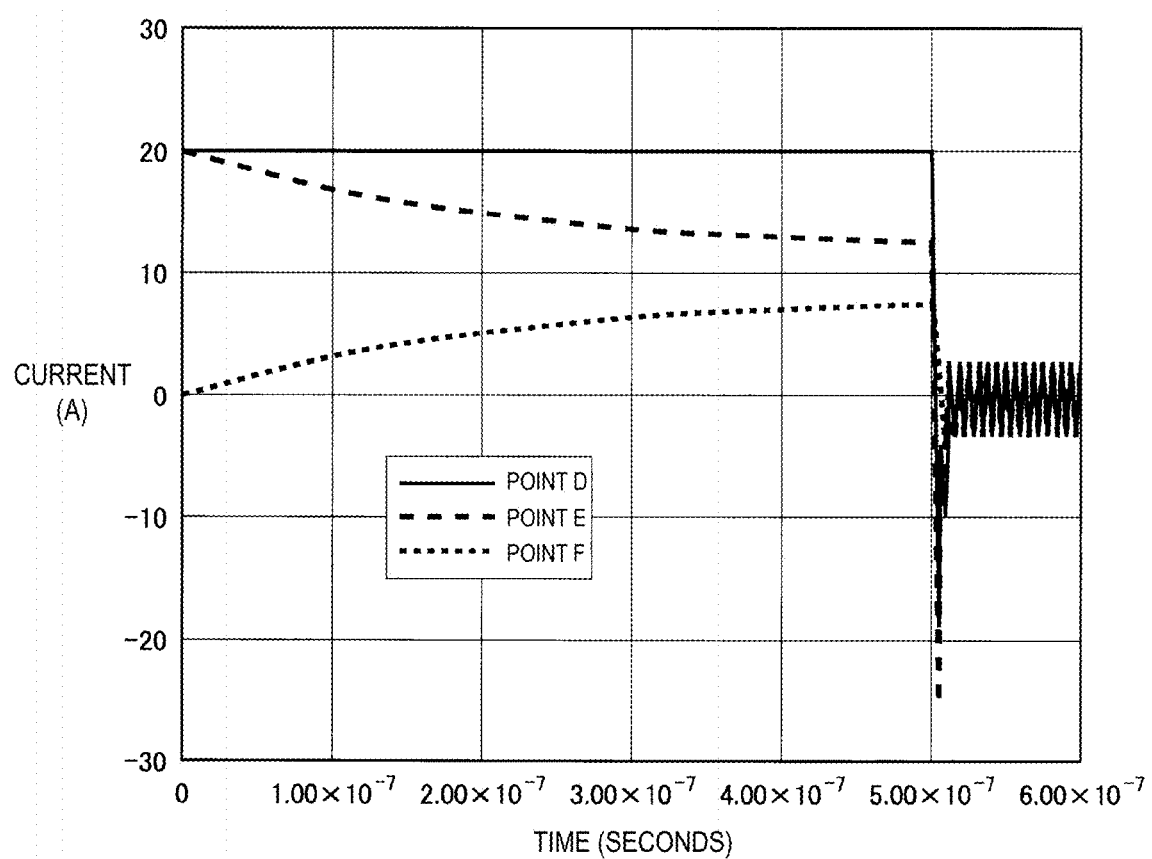
FIG. 11 is a waveform diagram of currents flowing through respective points illustrated in FIG. 9.
Figure 12:
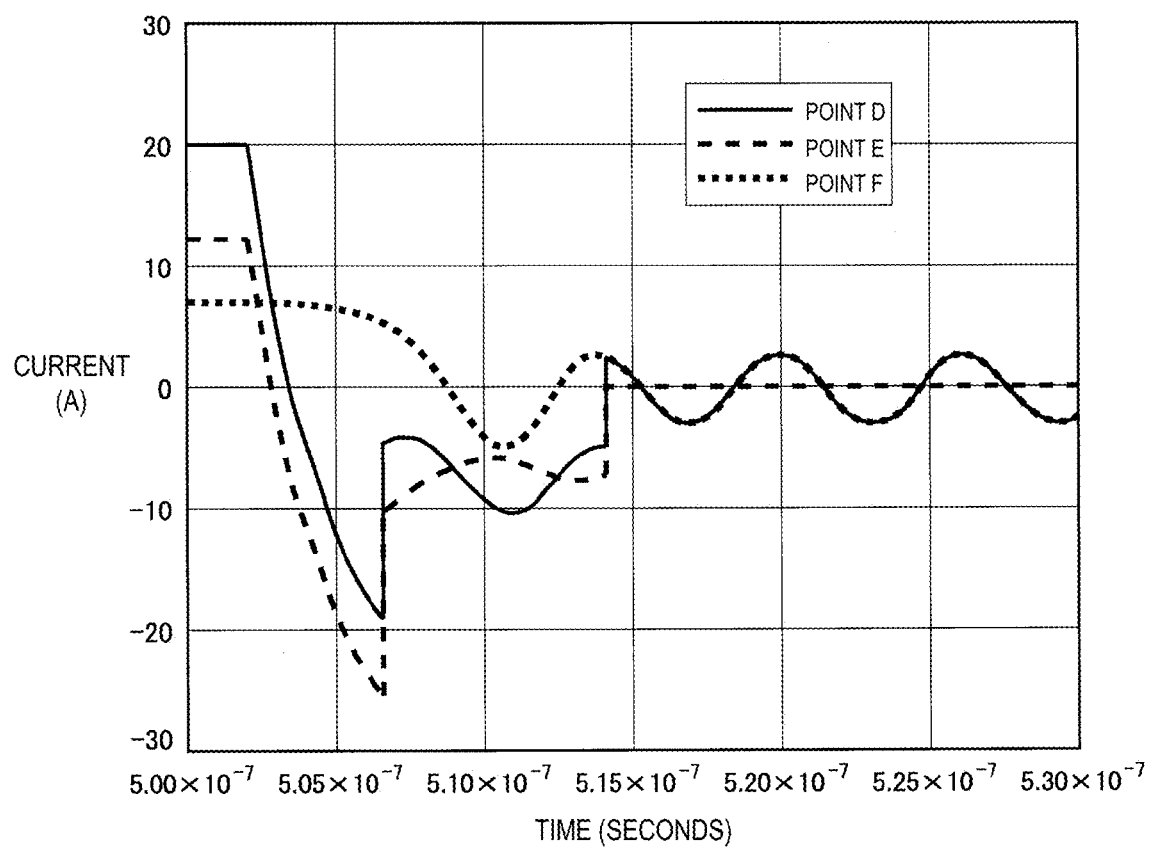
FIG. 12 is an enlarged view of FIG. 11.

FIG. 10 is a waveform diagram of the current flowing through the point D. FIG. 11 is a waveform diagram of the currents flowing through the points D, E, and F. In FIG. 11, a graph of a solid line shows a change in the current flowing through the point D, a graph of a long-dashed line shows a change in the current flowing through the point E, and a graph of a broken line shows a change in the current flowing through the point F. FIG. 11 corresponds to a broken line portion of FIG. 10. FIG. 12 is an enlarged view of FIG. 11. In FIG. 12, a portion of FIG. 11 from $5.00\times10^{-7}$ seconds to $5.30\times10^{-7}$ seconds is enlarged and illustrated.

The HEMT 42 switches at a prescribed period. When the HEMT 42 is in an ON state, a current flows through the coil 41 and the HEMT 42, and magnetic energy is accumulated in the coil 41. When the HEMT 42 is in an OFF state, the current flows through the coil 41 and the rectifying circuit 10, and the magnetic energy accumulated in the coil 41 is released. A rectified current flowing through the point D forms a rectangular wave as illustrated in FIG. 10, and a voltage obtained by stepping-up the output voltage of the DC power supply 48 is applied to the DC load 49.

The HEMT 11 switches in sync with the HEMT 42. More specifically, the HEMT 11 is turned on after the rectified current starts to flow, and is turned off before the flow of the rectified current is stopped. Further, part of the current that flows passing through the HEMT 11 when the HEMT 11 is in the ON state, flows passing through the diode 12 after the HEMT 11 is turned off.

Figure 13:
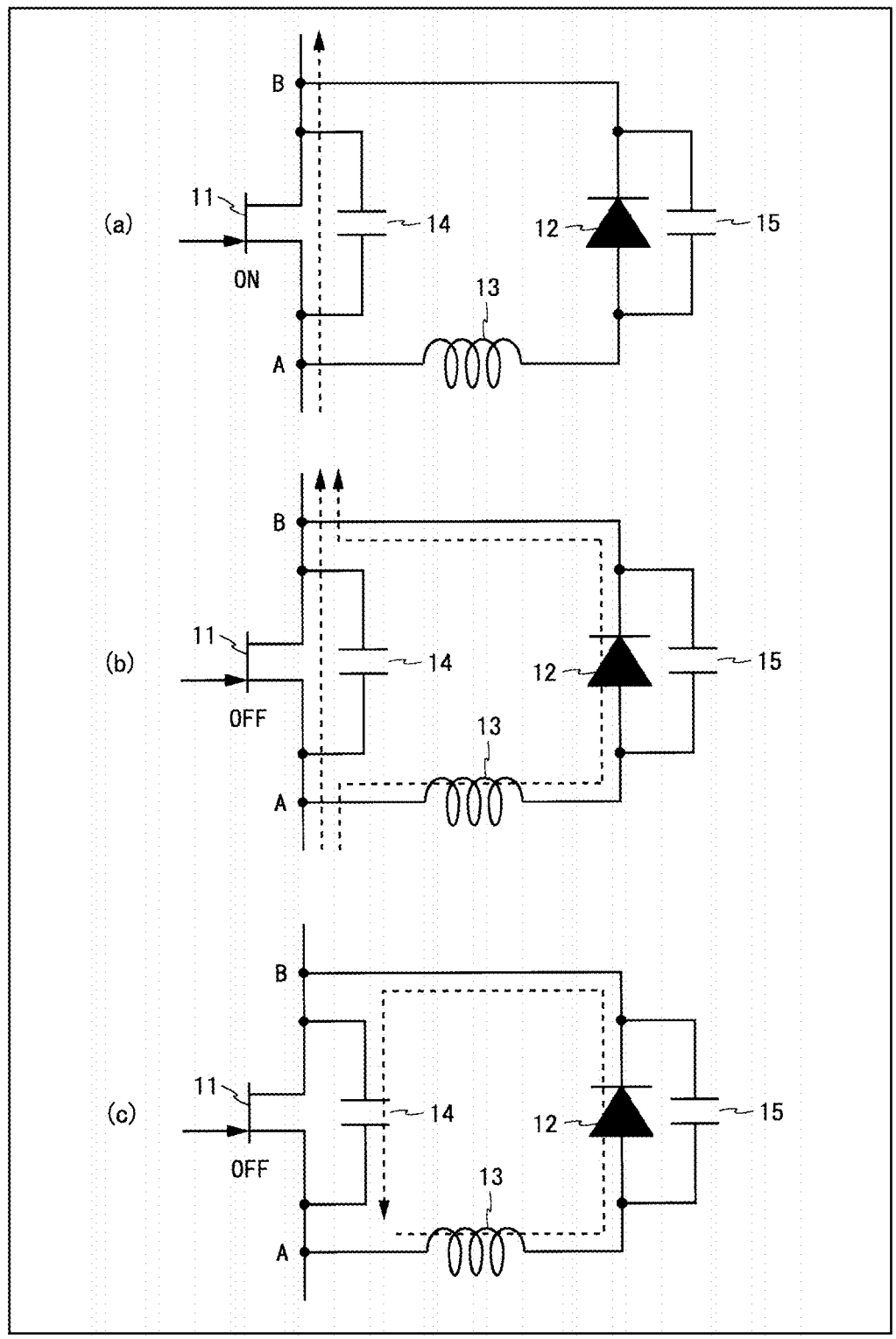
FIG. 13 is a diagram illustrating current pathways in the power supply circuit illustrated in FIG. 9.

FIG. 13 is a diagram illustrating current pathways in the rectifying circuit 10. First, a state is considered in which a rectified current does not flow through the rectifying circuit 10. When a rectified current is not flowing, the voltages of the output capacitance 14 and the parasitic capacitance 15 are high, and charge is accumulated in the output capacitance 14 and the parasitic capacitance 15. When the HEMT 11 is turned on in this state, loss is generated caused by the energy accumulated in the output capacitance 14 and the parasitic capacitance 15. As such, the HEMT 11 is turned on after a rectified current starts to flow through the rectifying circuit 10. When the rectified current flows, the charge accumulated in the output capacitance 14 and the parasitic capacitance 15 is discharged, and the voltages of the output capacitance 14 and the parasitic capacitance 15 are lowered. Thereafter, the HEMT 11 is turned on to make it possible to reduce the loss. In the above example, a situation in which the voltages of the output capacitance 14 and the parasitic capacitance 15 are lowered means that the voltage of 400 V becomes lower than 20% of the stated voltage (voltage of 80 V). It is more preferable that the voltages of the output capacitance 14 and the parasitic capacitance 15 be lower than 5% of the voltage of 400 V (voltage of 20 V).

FIG. 13(a) is a diagram illustrating a current pathway when a rectified current is flowing. At this time, a current of 20 A flows through the coil 41, and the current having passed through the coil 41 is allowed to flow into the rectifying circuit 10 by the electromotive force of the coil 41. In the rectifying circuit 10, a voltage drop is generated corresponding to the current of 20 A. In order to reduce the loss due to the above current, in the rectifying circuit 10, a voltage of 6 V is applied to the gate terminal of the HEMT 11 based on the source terminal of the HEMT 11. This turns on the HEMT 11. The on-resistance of the HEMT 11 during its reverse-conduction is about 50 ma. Accordingly, the voltage drop at the HEMT 11 is 1.0 V, so that a voltage of 1.0 V is applied to the point A based on the point B. Since the forward voltage drop when the diode 12 starts to be conductive is larger than 1.0 V, most of the current flowing through the rectifying circuit 10 flows through the HEMT 11. By performing synchronous rectification in this manner, it is possible to reduce conduction loss in the rectifying circuit 10.

Next, in the rectifying circuit 10, a voltage of 0 V is applied to the gate terminal of the HEMT 11 based on the source terminal of the HEMT 11. At this time, the HEMT 11 is turned off. FIG. 13(b) describes a current pathway immediately after the HEMT 11 is turned off. Since a current of 20 A flows through the rectifying circuit 10 after the HEMT 11 is turned off, the voltage drop in the rectifying circuit 10 comes to be 2.6 V (this value is derived from FIG. 4; when the voltage drop is 2.6 V, a current flowing through the HEMT 11 is 12 A, a current flowing through the diode 12 is 8 A, and the sum of the two currents comes to be 20 A). By part of the rectified current flowing through the diode 12, magnetic energy is accumulated in the inductor 13.

Next, in the step-up chopper circuit 40, a voltage of 6 V is applied to the gate terminal of the HEMT 42 based on the source terminal of the HEMT 42. At this time, the HEMT 42 is turned on. In FIG. 13(c), a current pathway after the HEMT 42 is turned on is described. When the HEMT 42 is turned on, since a current having passed through the coil 41 flows through the HEMT 42, the rectified current flowing through the point D decreases rapidly. Of the rectified current, a current flowing through the HEMT 11 (a current flowing through the point E) decreases rapidly, while a current flowing through the diode 12 (a current flowing through the point F) decreases at a slower rate than the current flowing through the HEMT 11 due to the action of the inductor 13.

In the example illustrated in FIG. 11 and FIG. 12, the HEMT 11 is in the ON state before 0 seconds. Before 0 seconds, the rectified current flowing through the rectifying circuit 10 all flows through the HEMT 11. At this time, a current flowing through the point D and a current flowing through the point E are 20 A, and a current flowing through the point F is 0 A. The HEMT 11 is turned off at 0 seconds. After $5.00 \times 10^{-7}$ seconds, the current flowing through the HEMT 11 is 12 A and the current flowing through the diode 12 is 8 A. The HEMT 42 is turned on at $5.02 \times 10^{-7}$ seconds. At $5.03 \times 10^{-7}$ seconds, the current flowing through the point D is 0 A, the current flowing through the point E is −8 A, and the current flowing through the point F is 8 A. At this time, the output capacitance 14 of the HEMT 11 is charged by the magnetic energy accumulated in the inductor 13.

Figure 14:
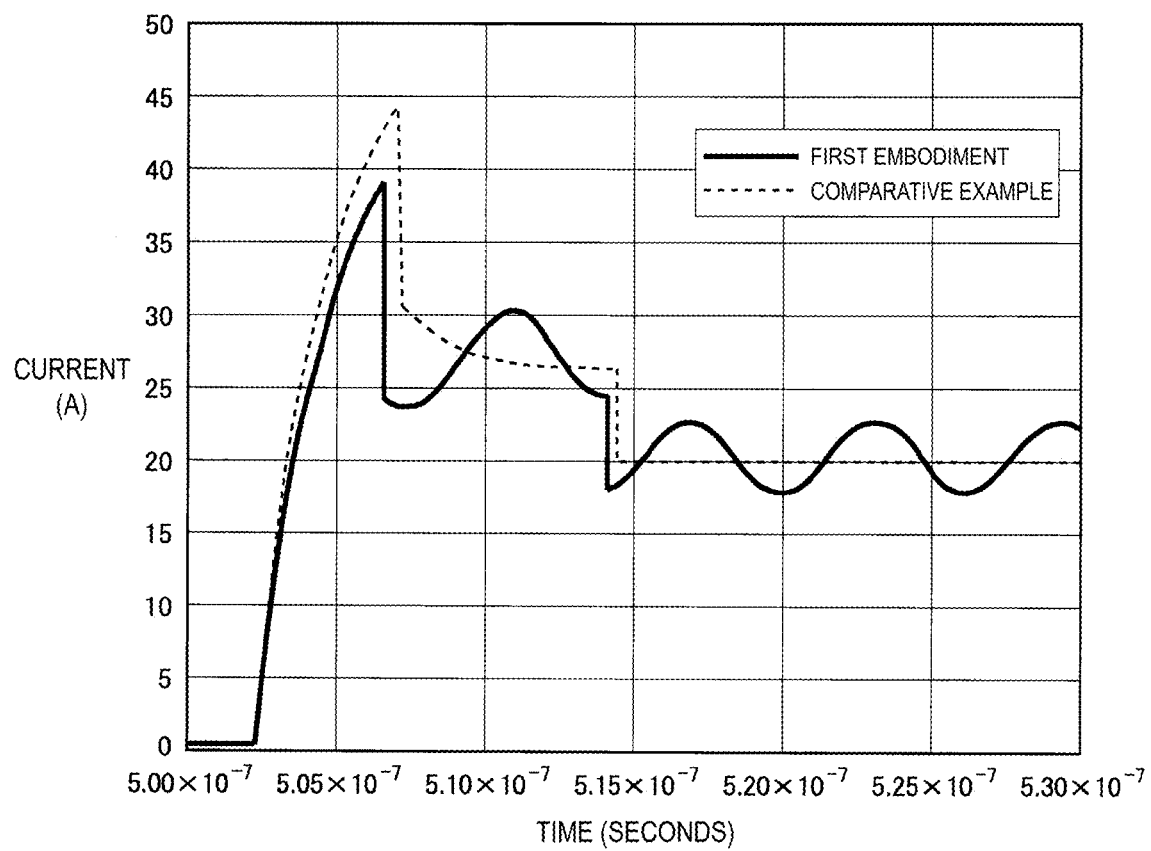
FIG. 14 is a waveform diagram of currents flowing through a point G illustrated in FIG. 9.
Figure 15:
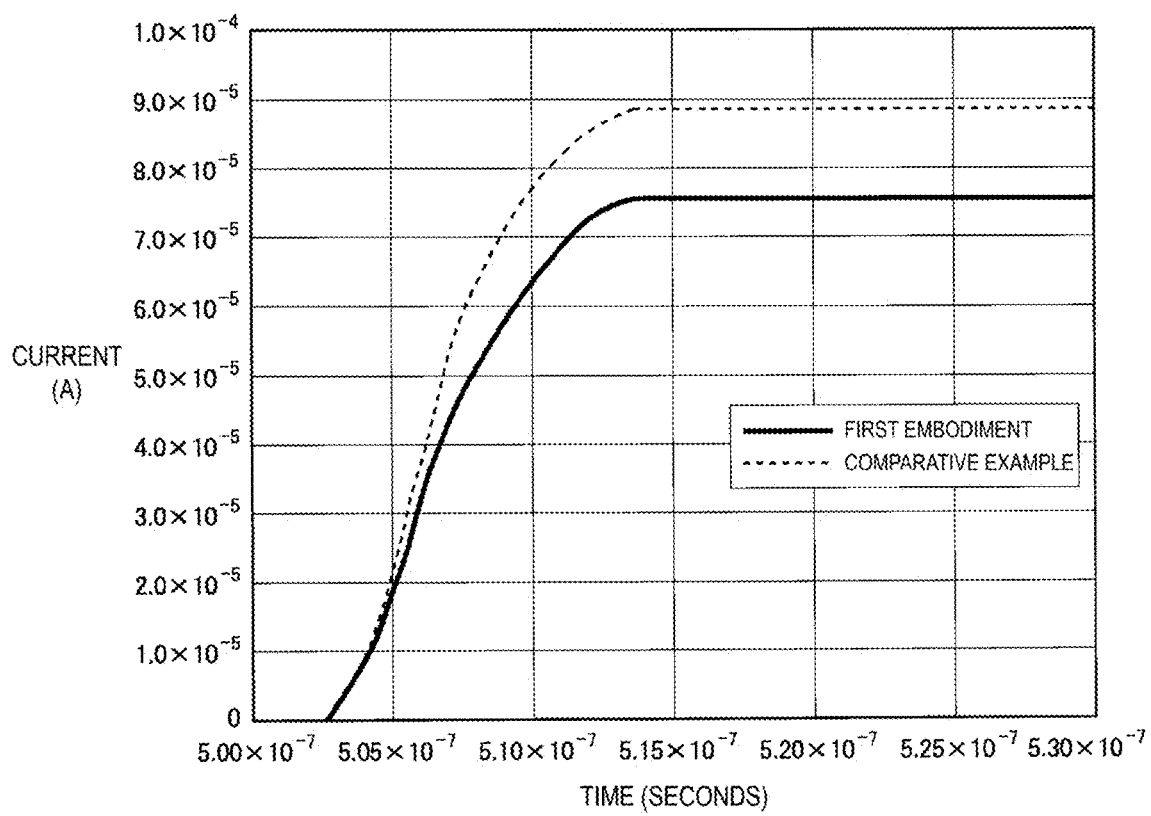
FIG. 15 is a diagram illustrating integrated values of switching loss in the power supply device illustrated in FIG. 9.

FIG. 14 is a waveform diagram of a current flowing through the point G. FIG. 15 is a diagram illustrating integrated values of switching loss in the output capacitance 14. In FIG. 14 and FIG. 15, a solid line indicates characteristics of the step-up chopper circuit 40, and a broken line indicates characteristics of a step-up chopper circuit provided with the rectifying circuit according to the comparative example (hereinafter referred to as a step-up chopper circuit according to the comparative example).

As indicated by the broken line in FIG. 14, in the step-up chopper circuit according to the comparative example, a current flowing through the point G has a maximum value of approximately 45 A near $5.07 \times 10^{-7}$ seconds. In contrast, as indicated by the solid line in FIG. 14, in the step-up chopper circuit 40, a current flowing through the point G has a maximum value of approximately 39 A near $5.07 \times 10^{-7}$ seconds. The latter is smaller than the former. Therefore, according to the step-up chopper circuit 40, loss can be reduced in comparison with the step-up chopper circuit according to the comparative example to the degree proportional to an amount of current by which the current in the step-up chopper circuit 40 is smaller than the current in the comparative example. In addition, since the current is small, the gate voltage can be kept stable.

The loss at the maximum current is mainly generated when the HEMT 42 changes from the OFF state to the ON state. The reason for this is that the on-resistance is not sufficiently lowered during the course of changing to the ON state. As indicated by the broken line in FIG. 15, in the step-up chopper circuit according to the comparative example, the loss during the switching period is $8.9 \times 10^{-5}$ J. In contrast, as indicated by the solid line in FIG. 15, in the step-up chopper circuit 40, the loss during the switching period is $7.5 \times 10^{-5}$ J. According to the step-up chopper circuit 40 as discussed above, loss can be reduced.

The HEMT has a problem that the gate voltage becomes unstable because of its small input capacitance. In a GaN-HEMT, a charge of 110 nC flows when a voltage of 400 V is applied to the output capacitance. This charge has influence on the surrounding magnetic field and electric field since it flows through not only the HEMT but also through all the conductive pathways from the voltage supply point of 400 V. In particular, the input capacitance of the GaN-HEMT is small. For example, when the charge accumulated in the output capacitance of the GaN-HEMT is 110 nC, the input capacitance of the GaN-HEMT may be 400 pF. In such a case, the gate voltage of the GaN-HEMT is susceptible to the surrounding magnetic field and electric field.

In the step-up chopper circuit 40, it is possible to suppress the amount of charge flowing per unit time. Accordingly, when the output capacitance 14 of the HEMT 11 is charged, it is possible to prevent the gate voltage of the HEMT 11 from becoming unstable under the influence of the surrounding magnetic field and electric field. The charge that charges the output capacitance 14 of the HEMT 11 passes through not only the HEMT 11 but also through the HEMT 42. Accordingly, when the output capacitance 14 of the HEMT 11 is charged, it is also possible to prevent the gate voltage of the HEMT 42 from becoming unstable under the influence of the surrounding magnetic field and electric field.

In the step-up chopper circuit 40, a voltage of 6 V is applied to the gate terminal based on the source terminal when the HEMT (specifically, the HEMT 11 or 42) is to be turned on, and a voltage of 0 V is applied to the gate terminal based on the source terminal when the HEMT is to be turned off. The reason for this is that, since the input capacitance of the HEMT is small and the gate voltage of the HEMT is likely to fluctuate, it is difficult to control the gate voltage of the HEMT by voltages of three or more steps.

As a method for stably maintaining the HEMT gate voltage at 6 V, a capacitor having a capacitance of five times or more (more preferably 10 times or more) the input capacitance of the HEMT may be connected in parallel to the input capacitance of the HEMT while the HEMT is turned on. It is preferable for the capacitance of the capacitor connected in parallel to be large. However, it is difficult to dispose a capacitor having a capacitance of one million times or more the input capacitance of the HEMT because the size of the capacitor is large.

As described above, the rectifying circuit 10 according to the present embodiment includes the HEMT 11, and the diode 12 connected in antiparallel to the HEMT 11. In the rectifying circuit 10, the forward voltage drop when the diode 12 starts to be conductive is smaller than the voltage drop when the HEMT 11 is reverse-conductive in the OFF state corresponding to an amount of rectified current when the HEMT 11 is reverse-conductive in the ON state. The inductance of a pathway extending through the diode 12 is larger than the inductance of a pathway extending through the HEMT 11 among the pathways connecting the source terminal and the drain terminal of the HEMT 11. The amount of charge accumulated in the parasitic capacitance 15 of the diode 12 is smaller than the amount of charge accumulated in the output capacitance 14 of the HEMT 11.

Accordingly, in the rectifying circuit 10, in the case where the HEMT 11 is reverse-conductive in the ON state and the rectified current is flowing, when the HEMT 11 is turned off, part of the rectified current flows passing through the diode 12, and magnetic energy is accumulated in the inductor 13 on the pathway extending through the diode 12 (a difference in inductance between the two pathways). When the flow of the rectified current is stopped, a low voltage is generated by the accumulated magnetic energy and the output capacitance 14 of the HEMT 11 is charged by the low voltage. Thus, switching loss due to the charge accumulated in the output capacitance 14 of the HEMT 11 may be reduced. In addition, by making the amount of charge accumulated in the parasitic capacitance 15 of the diode 12 smaller than the amount of charge accumulated in the output capacitance 14 of the HEMT 11, it is possible to reduce the switching loss due to the charge accumulated in the parasitic capacitance 15 of the diode 12. Furthermore, it is also possible to prevent the gate voltage of the HEMT from becoming unstable under the influence of the surrounding magnetic field and electric field.

The forward voltage drop of the diode 12 corresponding to 10% of the amount of rectified current when the HEMT 11 is reverse-conductive in the ON state is smaller, by equal to or greater than 0.2 V, than the voltage drop when the HEMT 11 is reverse-conductive in the OFF state corresponding to the amount of rectified current when the HEMT 11 is reverse-conductive in the ON state. By setting the difference in voltage drop to be equal to or greater than 0.2 V, it is possible to reliably flow a current on the pathway extending through the diode 12 when the HEMT 11 is turned off.

The threshold voltage of the HEMT 11 is in a range from 0.5 V to 5 V. This makes it possible to cause the forward voltage drop when the diode 12 starts to be conductive to be smaller than the voltage drop of the HEMT 11 during the reverse-conduction thereof, and makes it easy to flow a current on the pathway extending through the diode 12 when the HEMT 11 is turned off.

The HEMT 11 is turned on after the rectified current starts to flow, and is turned off before the flow of the rectified current is stopped. Part of the current that flows passing through the HEMT 11 when the HEMT 11 is reverse-conductive in the ON state, flows passing through the diode 12 after the HEMT 11 is turned off. When the rectified current flows, the voltage of the output capacitance 14 of the HEMT 11 and the voltage of the parasitic capacitance 15 of the diode 12 are lowered. Thereafter, the HEMT 11 is turned on to make it possible to reduce the loss. The current flows passing through the diode 12 and the inductor 13 after the HEMT 11 is turned off, so that the magnetic energy is accumulated in the inductor 13. When the flow of the rectified current is stopped, the output capacitance 14 of the HEMT 11 is charged by the low voltage generated in the inductor 13. Thus, switching loss due to the charge accumulated in the output capacitance 14 of the HEMT 11 may be reduced.

When the drain voltage of the HEMT 11 falls within a range from 0% to 10% of the rated voltage, the average of the output capacitance of the HEMT 11 is twice or more the output capacitance of the HEMT 11 when the drain voltage of the HEMT 11 takes the rated voltage. Accordingly, it is possible, when the voltage of the output capacitance 14 of the HEMT 11 is low, to charge the output capacitance 14 by the low voltage generated in the inductor 13 and effectively reduce the switching loss.

Note that the HEMT 11 includes a conductive layer under the two-dimensional electron gas layer 37. Accordingly, it is possible to reduce the switching loss in the rectifying circuit 10 using the HEMT 11 including the conductive layer under the two-dimensional electron gas layer 37. Further, the rectifying circuit 10 controls the gate voltage of the HEMT 11 to make it at the same level as the source voltage when the HEMT 11 is turned off. Thus, the HEMT 11 can be turned off by a simple circuit.

The power supply circuit (step-up chopper circuit 40) according to the present embodiment includes the rectifying circuit 10. With the power supply circuit according to the present embodiment, switching loss in the power supply circuit can be reduced by using the rectifying circuit 10 in which switching loss is reduced.

Second Embodiment

In a second embodiment, a method for providing an inductor 13 on a pathway extending through the diode 12 is described among the pathways connecting the source terminal and the drain terminal of the HEMT 11. The inductor 13 can be formed by using, for example, a wiring line pattern or a lead wire of a component. According to this method, the inductor 13 can be formed without adding a new component.

However, in a case where the inductor 13 is formed by the method described above, the wiring line pattern becomes long so that the loss due to the wiring line is increased. In addition, with the method described above, resonance may occur because of the following reasons. The output capacitance 14 of the HEMT 11 is also charged by the current supplied from the drain terminal side of the HEMT 11 in addition to the current flowing from the inductor 13. The voltage between the source and drain of the HEMT 11 changes at high speed, which in turn causes the voltage between the anode and cathode of the diode 12 to change at high speed. However, because of the presence of the inductor 13, the rise of the voltage between the anode and cathode of the diode 12 is delayed in comparison with the rise of the voltage between the source and drain of the HEMT 11. Due to the rise of the voltage, the parasitic capacitance 15 of the diode 12 is charged so that the resonance occurs. When the resonance occurs, radiation noise may be generated, the diode 12 may be broken in some cases.

Therefore, in the present embodiment, a circuit component made of a magnetic material is provided as the inductor 13 on a pathway extending through the diode 12. The magnetic material has a property that an inductance component decreases but a resistive component increases at a frequency of equal to or higher than 100 kHz, and at a frequency of equal to or higher than 1 GHz, the resistance component also decreases. The rectifying circuit according to the present embodiment resonates, typically, at a frequency in a range from 1 MHz to 500 MHz. This makes it possible to use the resistive component of a magnetic material. In particular, by using a ferrite material as a magnetic material, resonance can be more effectively reduced. A material suitable for the ferrite material may be selected from among manganese zinc (MnZn) based materials, nickel zinc (NiZn) based materials, and the like.

Figure 16:
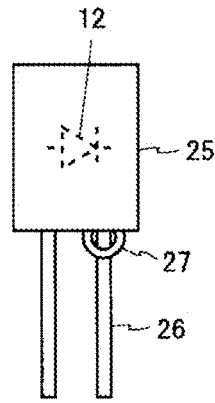
FIG. 16 is a diagram illustrating a method for providing an inductor in a rectifying circuit according to a second embodiment.

FIG. 16 is a diagram illustrating a method for providing the inductor 13. In FIG. 16, the diode 12 is built into a package 25 including two lead wires 26. By passing one of the lead wires 26 through a ferrite bead 27 made of a ferrite material, the inductor 13 can be disposed on a pathway extending through the diode 12. A component made of a magnetic material may be disposed in a similar manner on other wiring lines.

As described above, the rectifying circuit according to the present embodiment includes a component made of a magnetic material on the pathway extending through the diode 12 among the pathways connecting the source terminal and the drain terminal of the HEMT 11. Therefore, with the rectifying circuit according to the present embodiment, the inductance of the pathway extending through the diode 12 can be made larger than the inductance of the pathway extending through the HEMT 11. Moreover, since a large inductance can be formed even when the wiring line is short, the wiring line pattern can be shortened to reduce the loss caused by the wiring line.

Third Embodiment

Figure 17:
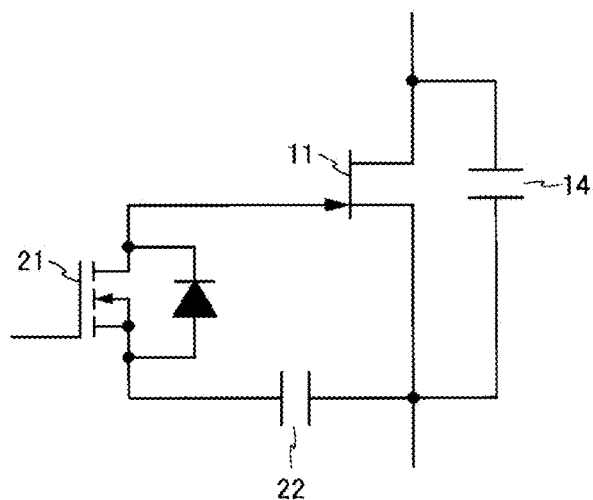
FIG. 17 is a diagram illustrating a method for controlling a gate voltage of a HEMT in a rectifying circuit according to a third embodiment.

In a third embodiment, a rectifying circuit in which switching loss is further reduced will be described. FIG. 17 is a diagram illustrating a method for controlling a gate voltage of a HEMT 11 in the rectifying circuit according to the present embodiment. As illustrated in FIG. 17, in the rectifying circuit according to the present embodiment, a transistor 21 and a capacitor 22 are provided between a gate terminal and a source terminal of the HEMT 11. A drain terminal of the transistor 21 is connected to the HEMT 11 gate terminal. A source terminal of the transistor 21 is connected to a first electrode (an electrode on the left side in FIG. 17) of the capacitor 22. A second electrode of the capacitor 22 is connected to the HEMT 11 source terminal. The capacitor 22 accumulates a prescribed amount of charge, and a voltage of the first electrode of the capacitor 22 is lower than a voltage of the second electrode thereof by a prescribed amount. A resistor, a diode, or the like may be provided on a pathway connecting the HEMT 11 and the transistor 21.

Hereinafter, it is considered that the HEMT 11 is a GaN-HEMT having a threshold voltage of 2 V, and a voltage between the electrodes of the capacitor 22 is 3 V. In this case, when the transistor 21 is turned on, the gate voltage of the HEMT 11 is lower than the source voltage by 3 V. In this manner, the rectifying circuit according to the present embodiment controls the gate voltage of the HEMT 11 to make it lower than the source voltage when the HEMT 11 is turned off.

The graph of the double-dot dash line illustrated in FIG. 4 is a graph showing the characteristics of the GaN-HEMT having a threshold voltage of 2 V when the voltage between the gate and the source is −3 V. The characteristics mentioned above are the same as the characteristics of the GaN-HEMT having a threshold voltage of 5 V when the voltage between the gate and the source is 0 V. In the rectifying circuit according to the present embodiment, the voltage drop of the GaN-HEMT during its reverse-conduction is higher than that in the first embodiment by 3 V.

As the voltage drop of the HEMT 11 during its reverse-conduction is larger, the current flowing through the HEMT 11 is decreased, and the current flowing through the diode 12 and the inductor 13 is increased. Accordingly, by using a larger amount of current flowing through the inductor 13 to charge the output capacitance 14 of the HEMT 11, it is possible to reduce the switching loss.

As described above, the rectifying circuit according to the present embodiment controls the gate voltage of the HEMT 11 to make it lower than the source voltage when the HEMT 11 is turned off. This makes it possible to increase the voltage drop of the HEMT 11 during its reverse-conduction. Therefore, with the rectifying circuit according to the present embodiment, by flowing a larger amount of current on the pathway extending through the diode 12 and the inductor 13, the switching loss can be further reduced. Alternatively, it is also possible to constitute a rectifying circuit in which switching loss is reduced by using a HEMT having a threshold voltage of equal to or smaller than 0 V.

Due to the manufacturing and structural constraints, it is difficult to set the threshold voltage of the HEMT to an arbitrary value. In the current technology, the upper limit of the threshold voltage is about 2 V. Thus, as in the present embodiment, by applying a negative voltage to the gate terminal of the HEMT, the stated HEMT can be used in the same manner as a HEMT having a high threshold voltage (see FIG. 4). As a result, it is possible to widen a range in which the current flowing through the diode can be controlled.

Fourth Embodiment

In a fourth embodiment, other power supply circuits including the rectifying circuit 10 according to the first embodiment will be described. In each power supply circuit described below, the rectifying circuit 10 is provided at a position where a diode or a silicon transistor is provided in the case of a typical power supply circuit.

Figure 18:
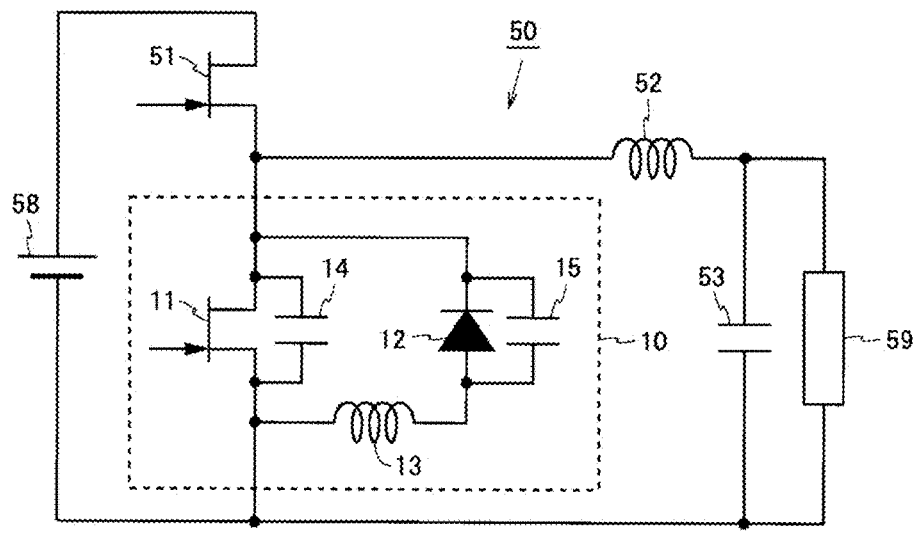
FIG. 18 is a circuit diagram of a power supply circuit (step-down chopper circuit) according to a first example of a fourth embodiment.

FIG. 18 is a circuit diagram of a power supply circuit (step-down chopper circuit) according to a first example. A step-down chopper circuit 50 illustrated in FIG. 18 includes the rectifying circuit 10, a switching element 51, a coil 52 and a smoothing capacitor 53, and is connected to a DC power supply 58 and a DC load 59. A drain terminal of the switching element 51 is connected to a positive electrode of the DC power supply 58. A source terminal of the switching element 51 is connected to a first terminal (a terminal on the upper side in FIG. 18) of the rectifying circuit 10 and to one end (the left end in FIG. 18) of the coil 52. The other end of the coil 52 is connected to one end (the upper end in FIG. 18) of the DC load 59. A second terminal of the rectifying circuit 10 is connected to a negative electrode of the DC power supply 58 and to the other end of the DC load 59. The smoothing capacitor 53 is disposed between both the ends of the DC load 59.

A silicon transistor, an insulated gate bipolar transistor (IGBT), a HEMT, or the like is used for the switching elements 51. The rectifying circuit 10 has a function to flow a rectified current upward in the drawing. By providing the rectifying circuit 10 at the position where a diode is provided, it is possible to constitute the step-down chopper circuit 50 in which switching loss is reduced.

Figure 19:
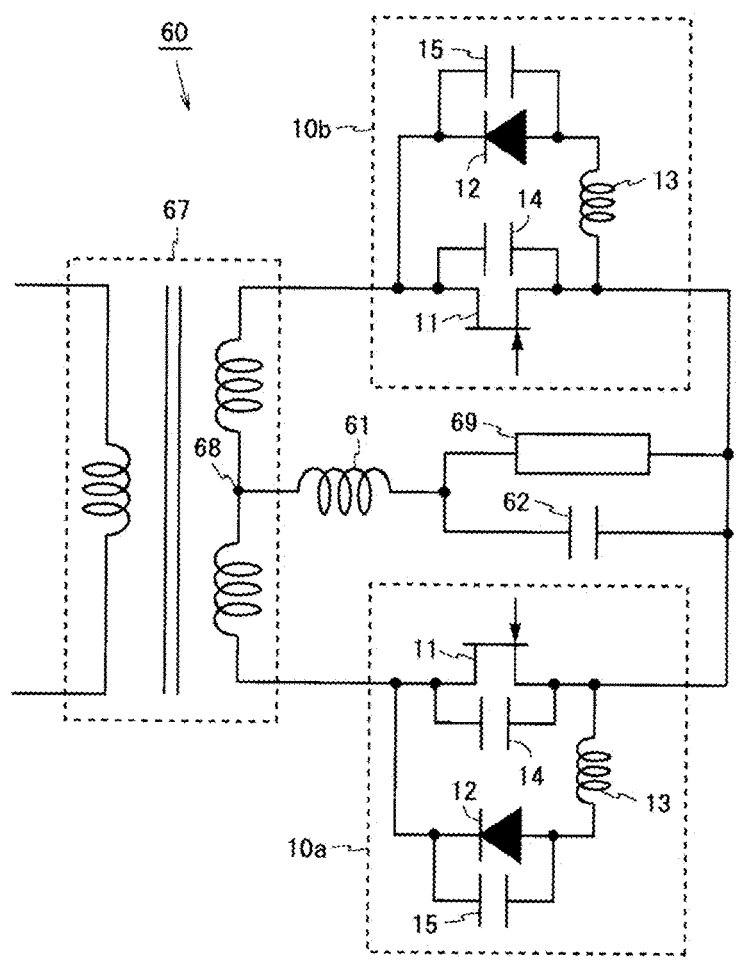
FIG. 19 is a circuit diagram of a power supply circuit (center tap rectifying circuit) according to a second example of the fourth embodiment.

FIG. 19 is a circuit diagram of a power supply circuit (a center tap rectifying circuit of an insulation-type DC/DC converter) according to a second example. In FIG. 19, a switching circuit (not illustrated) such as a full-bridge circuit or push-pull circuit is connected to the primary side of an isolation transformer 67. The secondary winding wire of the isolation transformer 67 includes a center tap 68. A center tap rectifying circuit 60 includes two rectifying circuits 10*a* and 10*b*, a smoothing coil 61 and a smoothing capacitor 62, and is connected to both ends and the center tap 68 of the secondary winding wire of the isolation transformer 67, and to a DC load 69. A first terminal (a terminal on the left side in FIG. 19) of the rectifying circuit 10*a* is connected to one end (the lower end in FIG. 19) of the secondary winding wire of the isolation transformer 67. A first terminal of the rectifying circuit 10*b* is connected to the other end of the secondary winding wire of the isolation transformer 67. One end (the left end in FIG. 19) of the smoothing coil 61 is connected to the center tap 68. The other end of the smoothing coil 61 is connected to one end (the left end in FIG. 19) of the DC load 69. A second terminal of each of the rectifying circuits 10*a* and 10*b* is connected to the other end of the DC load 69. The smoothing capacitor 62 is disposed between both the ends of the DC load 69.

Each of the rectifying circuits 10*a* and 10*b* has a function to flow a rectified current leftward in the drawing. By providing the rectifying circuits 10*a* and 10*b* at the positions where diodes are provided, it is possible to constitute the center tap rectifying circuit 60 in which switching loss is reduced.

Figure 20:
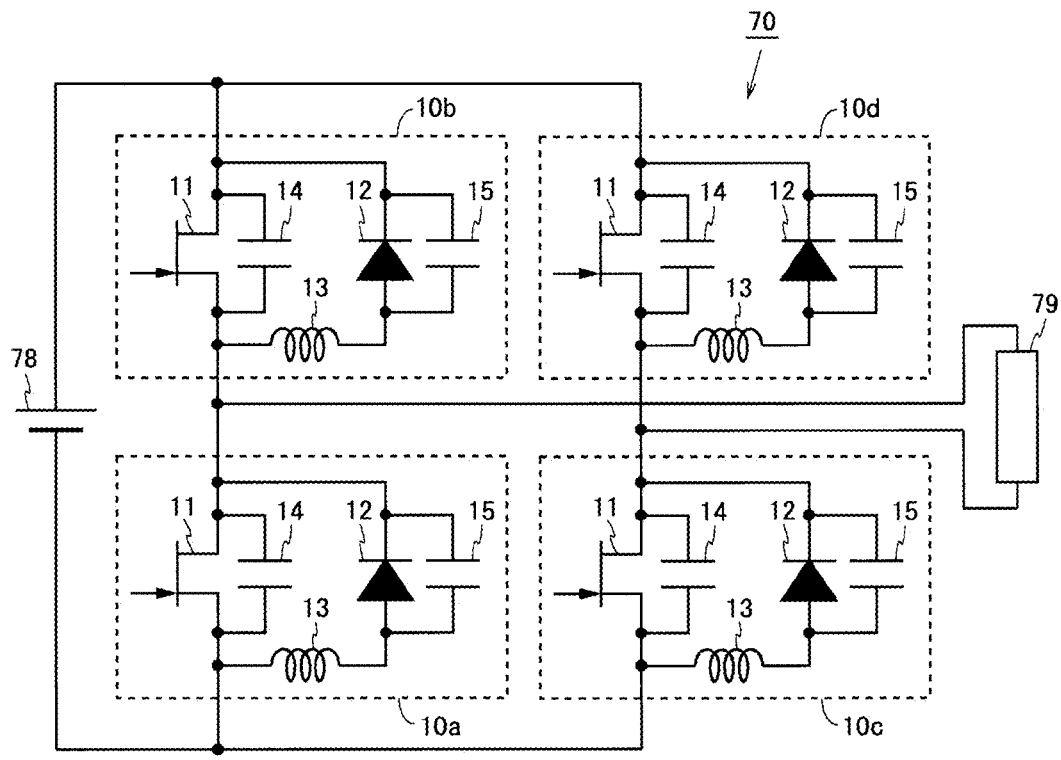
FIG. 20 is a circuit diagram of a power supply circuit (inverter circuit) according to a third example of the fourth embodiment.

FIG. 20 is a circuit diagram of a power supply circuit (inverter circuit) according to a third example. An inverter circuit 70 illustrated in FIG. 20 includes four rectifying circuits 10*a* to 10*d*, and is connected to a DC power supply 78 and an AC load 79. The AC load 79 includes a coil (not illustrated). A first terminal (a terminal on the upper side in FIG. 20) of each of the rectifying circuits 10*b* and 10*d* is connected to a positive electrode of the DC power supply 78. Second terminals of the rectifying circuits 10*b* and 10*d* are connected to first terminals of the rectifying circuits 10*a* and 10*c*, respectively. A second terminal of each of the rectifying circuits 10*a* and 10*c* is connected to a negative electrode of the DC power supply 78. A connection point of the rectifying circuits 10*a* and 10*b* is connected to one end (the upper end in FIG. 20) of the AC load 79, and a connection point of the rectifying circuits 10*c* and 10*d* is connected to the other end of the AC load 79.

The rectifying circuits 10*a* to 10*d* selectively perform operation as a switch and operation as a rectifying circuit. When a HEMT 11 is in an ON state with a positive voltage applied to the first terminal side, a forward current flows from the drain terminal toward the source terminal of the HEMT 11 (from the first terminal toward the second terminal of each of the rectifying circuits 10*a* to 10*d*). At this time, each of the rectifying circuits 10*a* to 10*d* operates as a switch. With a positive voltage applied to the second terminal side, the rectifying circuits 10*a* to 10*d* flow a rectified current. At this time, each of the rectifying circuits 10*a* to 10*d* operates as a rectifying circuit. By providing the rectifying circuits 10*a* to 10*d* at the positions where silicon transistors are provided, it is possible to constitute the inverter circuit 70 in which switching loss is reduced.

A three-phase inverter circuit may be constituted by adding a circuit in which two rectifying circuits 10 are connected in series, to the inverter circuit 70. As a result, a three-phase inverter circuit in which switching loss is reduced may be constituted.

Figure 21:
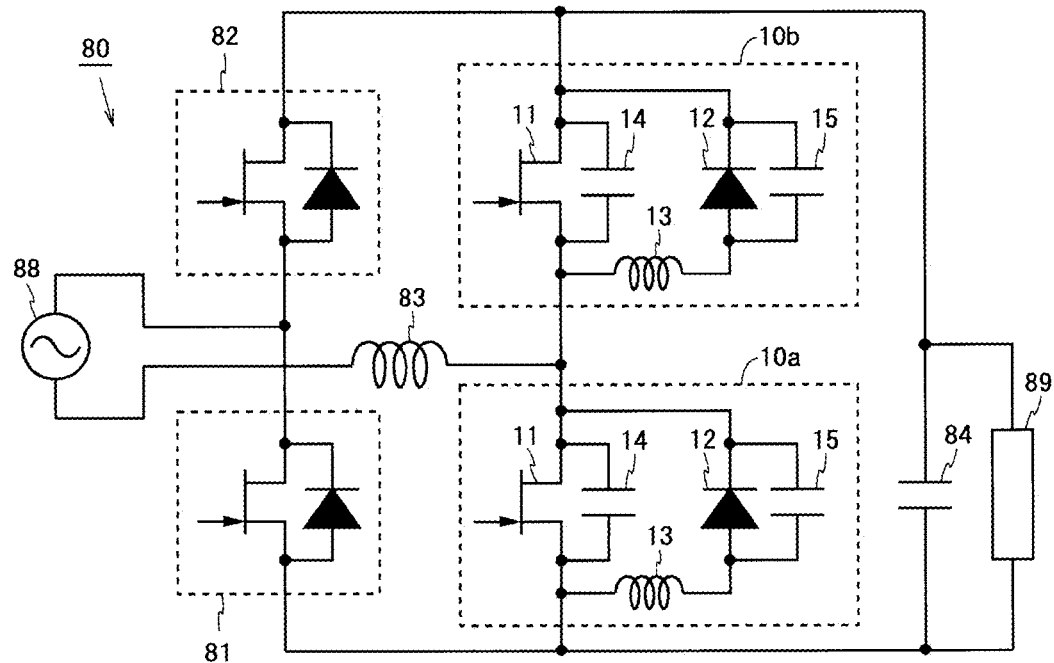
FIG. 21 is a circuit diagram of a power supply circuit (totem-pole power factor improvement circuit) according to a fourth example of the fourth embodiment.

FIG. 21 is a circuit diagram of a power supply circuit (totem-pole power factor improvement circuit) according to a fourth example. A totem-pole power factor improvement circuit 80 illustrated in FIG. 21 includes two silicon transistors 81 and 82, two rectifying circuits 10*a* and 10*b*, a smoothing coil 83 and a smoothing capacitor 84, and is connected to an AC power supply 88 and a DC load 89. One end (the upper end in FIG. 21) of the AC power supply 88 is connected to a drain terminal of the silicon transistor 81 and a source terminal of the silicon transistor 82. The other end of the AC power supply 88 is connected to one end (the left end in FIG. 21) of the smoothing coil 83. The other end of the smoothing coil 83 is connected to a first terminal (a terminal on the upper side in FIG. 21) of the rectifying circuit 10*a* and to a second terminal of the rectifying circuit 10*b*. A drain terminal of the silicon transistor 82 is connected to a first terminal of the rectifying circuit 10*b* and to one end (the upper end in FIG. 21) of the DC load 89. A source terminal of the silicon transistor 81 is connected to a second terminal of the rectifying circuit 10*a* and to the other end of the DC load 89. The smoothing capacitor 84 is disposed between both the ends of the DC load 89.

The silicon transistors 81 and 82 are switched at a commercial frequency (for example, a frequency in a range from 50 Hz to 60 Hz). The rectifying circuits 10*a* and 10*b* are switched at a relatively high frequency (for example, a frequency in a range from 10 kHz to 200 kHz). The smoothing coil 83 smoothes an input current and the smoothing capacitor 84 smoothes an output voltage. The rectifying circuits 10*a* and 10*b* selectively perform operation as a switch and operation as a rectifying circuit. By providing the rectifying circuits 10*a* and 10*b* at the positions where silicon transistors are provided, it is possible to constitute the totem-pole power factor improvement circuit 80 in which switching loss is reduced.

The power supply circuits according to the first to fourth examples may include the rectifying circuit according to the second or third embodiment instead of the rectifying circuit 10 according to the first embodiment. As described above, the power supply circuit according to the present embodiment includes any one of the rectifying circuits according to the first to third embodiments. According to the power supply circuit according to the present embodiment, it is possible to reduce switching loss of the power supply circuit by using the rectifying circuit in which switching loss is reduced.

This application claims the benefit of priority to JP 2017-120527 entitled "Rectifying Circuit and Power Supply Device" filed on Jun. 20, 2017. The entire contents of the above-identified application are hereby incorporated by reference.

REFERENCE SIGNS LIST

10 Rectifying circuit
11 HEMT
12 Diode

13 Inductor
14 Output capacitance
15 Parasitic capacitance
27 Ferrite bead
31 Silicon substrate (Conductive layer)
37 Two-dimensional electronic gas layer
40 Step-up chopper circuit
50 Step-down chopper circuit
60 Center tap rectifying circuit
70 Inverter circuit
80 Totem-pole power factor improvement circuit

The invention claimed is:

1. A rectifying circuit comprising:
a HEMT; and
a diode connected antiparallel to the HEMT,
wherein a forward voltage drop of the diode when the diode starts to be conductive is smaller than a voltage drop of the HEMT when the HEMT is reverse-conductive in an OFF state corresponding to an amount of rectified current when the HEMT is reverse-conductive in an ON state,
inductance of a pathway extending through the diode is larger than inductance of a pathway extending through the HEMT among the pathways connecting a source terminal and a drain terminal of the HEMT, and
an amount of charge accumulated in a parasitic capacitance of the diode is smaller than an amount of charge accumulated in an output capacitance of the HEMT.

2. The rectifying circuit according to claim 1,
wherein the forward voltage drop of the diode corresponding to 10% of the amount of rectified current when the HEMT is reverse-conductive in the ON state is smaller, by equal to or greater than 0.2 V, than the voltage drop of the HEMT when the HEMT is reverse-conductive in the OFF state corresponding to the amount of rectified current when the HEMT is reverse-conductive in the ON state.

3. The rectifying circuit according to claim 2,
wherein a threshold voltage of the HEMT is equal to or higher than 0.5 V and equal to or lower than 5 V.

4. The rectifying circuit according to claim 3,
wherein the HEMT is turned on after the rectified current starts to flow, and is turned off before a flow of the rectified current is stopped, and
part of the current that flows passing through the HEMT when the HEMT is reverse-conductive in the ON state, flows passing through the diode after the HEMT is turned off.

5. The rectifying circuit according to claim 3,
wherein an average of the output capacitance of the HEMT when a drain voltage of the HEMT falls within a range from 0% to 10% of a rated voltage, is twice or more the output capacitance of the HEMT when the drain voltage of the HEMT takes the rated voltage.

6. The rectifying circuit according to claim 2,
wherein the HEMT is turned on after the rectified current starts to flow, and is turned off before a flow of the rectified current is stopped, and
part of the current that flows passing through the HEMT when the HEMT is reverse-conductive in the ON state, flows passing through the diode after the HEMT is turned off.

7. The rectifying circuit according to claim 2,
wherein an average of the output capacitance of the HEMT when a drain voltage of the HEMT falls within a range from 0% to 10% of a rated voltage, is twice or more the output capacitance of the HEMT when the drain voltage of the HEMT takes the rated voltage.

8. The rectifying circuit according to claim 1,
wherein a threshold voltage of the HEMT is equal to or higher than 0.5 V and equal to or lower than 5 V.

9. The rectifying circuit according to claim 8,
wherein the HEMT is turned on after the rectified current starts to flow, and is turned off before a flow of the rectified current is stopped, and
part of the current that flows passing through the HEMT when the HEMT is reverse-conductive in the ON state, flows passing through the diode after the HEMT is turned off.

10. The rectifying circuit according to claim 8,
wherein an average of the output capacitance of the HEMT when a drain voltage of the HEMT falls within a range from 0% to 10% of a rated voltage, is twice or more the output capacitance of the HEMT when the drain voltage of the HEMT takes the rated voltage.

11. The rectifying circuit according to claim 1,
wherein the HEMT is turned on after the rectified current starts to flow, and is turned off before a flow of the rectified current is stopped, and
part of the current that flows passing through the HEMT when the HEMT is reverse-conductive in the ON state, flows passing through the diode after the HEMT is turned off.

12. The rectifying circuit according to claim 11,
wherein an average of the output capacitance of the HEMT when a drain voltage of the HEMT falls within a range from 0% to 10% of a rated voltage, is twice or more the output capacitance of the HEMT when the drain voltage of the HEMT takes the rated voltage.

13. A power supply device comprising:
the rectifying circuit according to claim 11.

14. The rectifying circuit according to claim 1,
wherein an average of the output capacitance of the HEMT when a drain voltage of the HEMT falls within a range from 0% to 10% of a rated voltage, is twice or more the output capacitance of the HEMT when the drain voltage of the HEMT takes the rated voltage.

15. A power supply device comprising:
the rectifying circuit according to claim 14.

16. The rectifying circuit according to claim 1,
wherein the HEMT includes a conductive layer under a two-dimensional electron gas layer.

17. The rectifying circuit according to claim 1, further comprising:
a component made of a magnetic material on a pathway extending through the diode.

18. The rectifying circuit according to claim 1,
wherein a gate voltage of the HEMT is controlled to be at a level of voltage identical to a source voltage of the HEMT when the HEMT is turned off.

19. The rectifying circuit according to claim 1,
wherein a gate voltage of the HEMT is controlled to be lower than a source voltage of the HEMT when the HEMT is turned off.

20. A power supply device comprising:
the rectifying circuit according to claim 1.

* * * * *

UNITED STATES PATENT AND TRADEMARK OFFICE
CERTIFICATE OF CORRECTION

Page 1 of 1

PATENT NO.           : 10,848,076 B2
APPLICATION NO.      : 16/613960
DATED                : November 24, 2020
INVENTOR(S)          : Takeshi Shiomi It is certified that error appears in the above-identified patent and that said Letters Patent is hereby corrected as shown below:

On the Title Page

The following should be added:
(30) Foreign Application Priority Data
June 20, 2017 (JP).........................2017-120527

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*